(12) United States Patent
Zhou et al.

(10) Patent No.: US 11,114,451 B1
(45) Date of Patent: Sep. 7, 2021

(54) METHOD OF FORMING A DEVICE WITH FINFET SPLIT GATE NON-VOLATILE MEMORY CELLS AND FINFET LOGIC DEVICES

(71) Applicant: Silicon Storage Technology, Inc., San Jose, CA (US)

(72) Inventors: Feng Zhou, Fremont, CA (US); Xian Liu, Sunnyvale, CA (US); JinHo Kim, Saratoga, CA (US); Serguei Jourba, Aix en Provence (FR); Catherine Decobert, Pourrieres (FR); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 27 days.

(21) Appl. No.: 16/803,876

(22) Filed: Feb. 27, 2020

(51) Int. Cl.
| | |
|---|---|
| *H01L 27/11534* | (2017.01) |
| *H01L 27/11521* | (2017.01) |
| *H01L 29/423* | (2006.01) |
| *H01L 27/11517* | (2017.01) |
| *H01L 29/66* | (2006.01) |

(52) U.S. Cl.
CPC .. *H01L 27/11534* (2013.01); *H01L 27/11517* (2013.01); *H01L 27/11521* (2013.01); *H01L 29/42324* (2013.01); *H01L 29/42328* (2013.01); *H01L 29/66545* (2013.01)

(58) Field of Classification Search
CPC ............. H01L 27/115; H01L 27/11517; H01L 27/11521; H01L 27/11534; H01L 29/42324; H01L 29/42328; H01L 29/66545
See application file for complete search history.

(56) References Cited

U.S. PATENT DOCUMENTS

| | | | |
|---|---|---|---|
| 6,747,310 B2 | 6/2004 | Fan et al. |
| 7,315,056 B2 | 1/2008 | Klinger et al. |
| 7,410,913 B2 | 8/2008 | Lee et al. |
| 7,423,310 B2 | 9/2008 | Verhoeven |

(Continued)

FOREIGN PATENT DOCUMENTS

WO 2016/209280 A1 12/2016

OTHER PUBLICATIONS

U.S. Appl. No. 16/208,150, filed Dec. 3, 2018, Zhou et al.
U.S. Appl. No. 16/208,288, filed Dec. 3, 2018, Jourba et al.
U.S. Appl. No. 16/724,010, filed Dec. 20, 2019, Jourba et al.

*Primary Examiner* — Matthew E Warren
(74) *Attorney, Agent, or Firm* — DLA Piper LLP (US)

(57) ABSTRACT

A method of forming a device with a silicon substrate having upwardly extending first and second fins. A first implantation forms a first source region in the first silicon fin. A second implantation forms a first drain region in the first silicon fin, and second source and drain regions in the second silicon fin. A first channel region extends between the first source and drain regions. A second channel region extends between the second source and drain regions. A first polysilicon deposition is used to form a floating gate that wraps around a first portion of the first channel region. A second polysilicon deposition is used to form an erase gate wrapping around first source region, a word line gate wrapping around a second portion of the first channel region, and a dummy gate wrapping around the second channel region. The dummy gate is replaced with a metal gate.

18 Claims, 20 Drawing Sheets

(56) References Cited

U.S. PATENT DOCUMENTS

| | | |
|---|---|---|
| 7,868,375 B2 | 1/2011 | Liu et al. |
| 8,461,640 B2 | 6/2013 | Hu et al. |
| 9,634,018 B2 | 4/2017 | Su et al. |
| 9,972,630 B2 | 5/2018 | Su et al. |
| 10,217,850 B2 | 2/2019 | Zhou et al. |
| 10,249,631 B2 | 4/2019 | Su et al. |
| 10,312,247 B1 | 6/2019 | Jourba et al. |
| 10,468,428 B1 | 11/2019 | Zhou et al. |
| 10,644,011 B1 * | 5/2020 | Fan .................... H01L 27/11521 |
| 2015/0035039 A1 * | 2/2015 | Li .......................... H01L 29/785 |
| | | 257/316 |
| 2016/0064398 A1 * | 3/2016 | Toh ................... H01L 29/66825 |
| | | 257/316 |
| 2016/0379987 A1 * | 12/2016 | Liu ..................... H01L 29/7851 |
| | | 257/316 |
| 2017/0084625 A1 * | 3/2017 | Takeuchi .............. H01L 29/792 |
| 2017/0243955 A1 | 8/2017 | Shinohara |
| 2020/0013786 A1 | 1/2020 | Jourba et al. |
| 2020/0227424 A1 * | 7/2020 | Tran ................... H01L 29/66825 |

\* cited by examiner

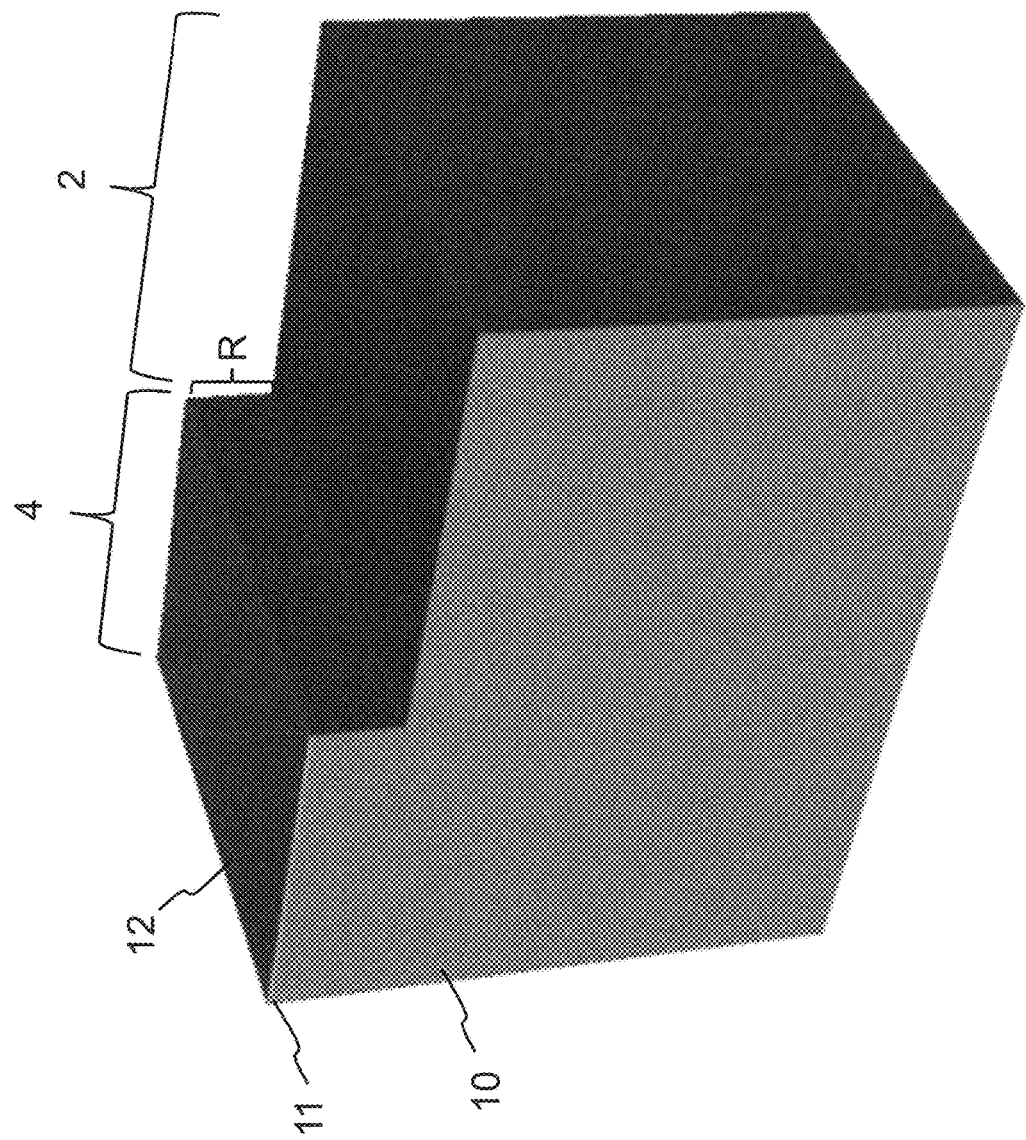

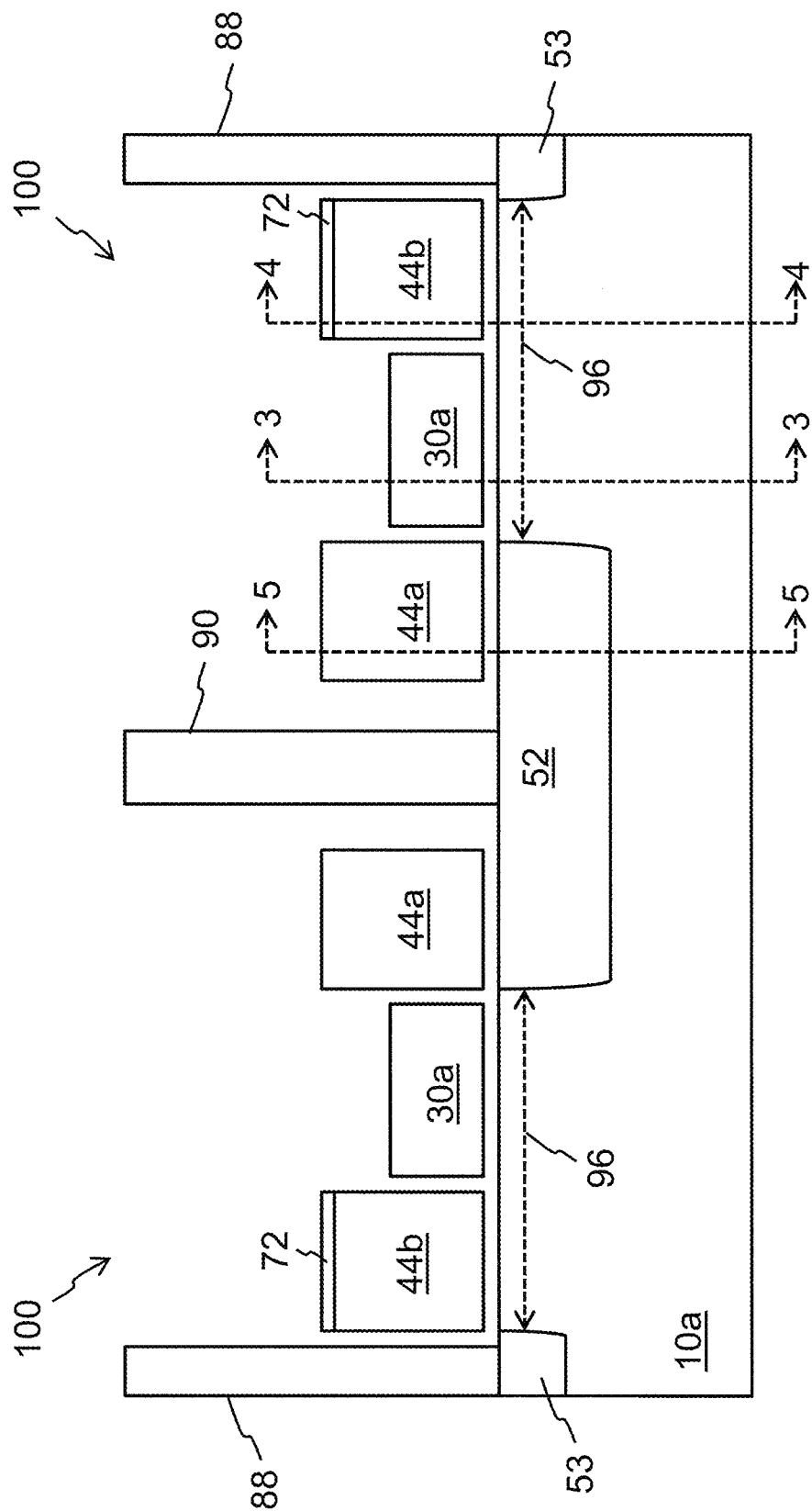

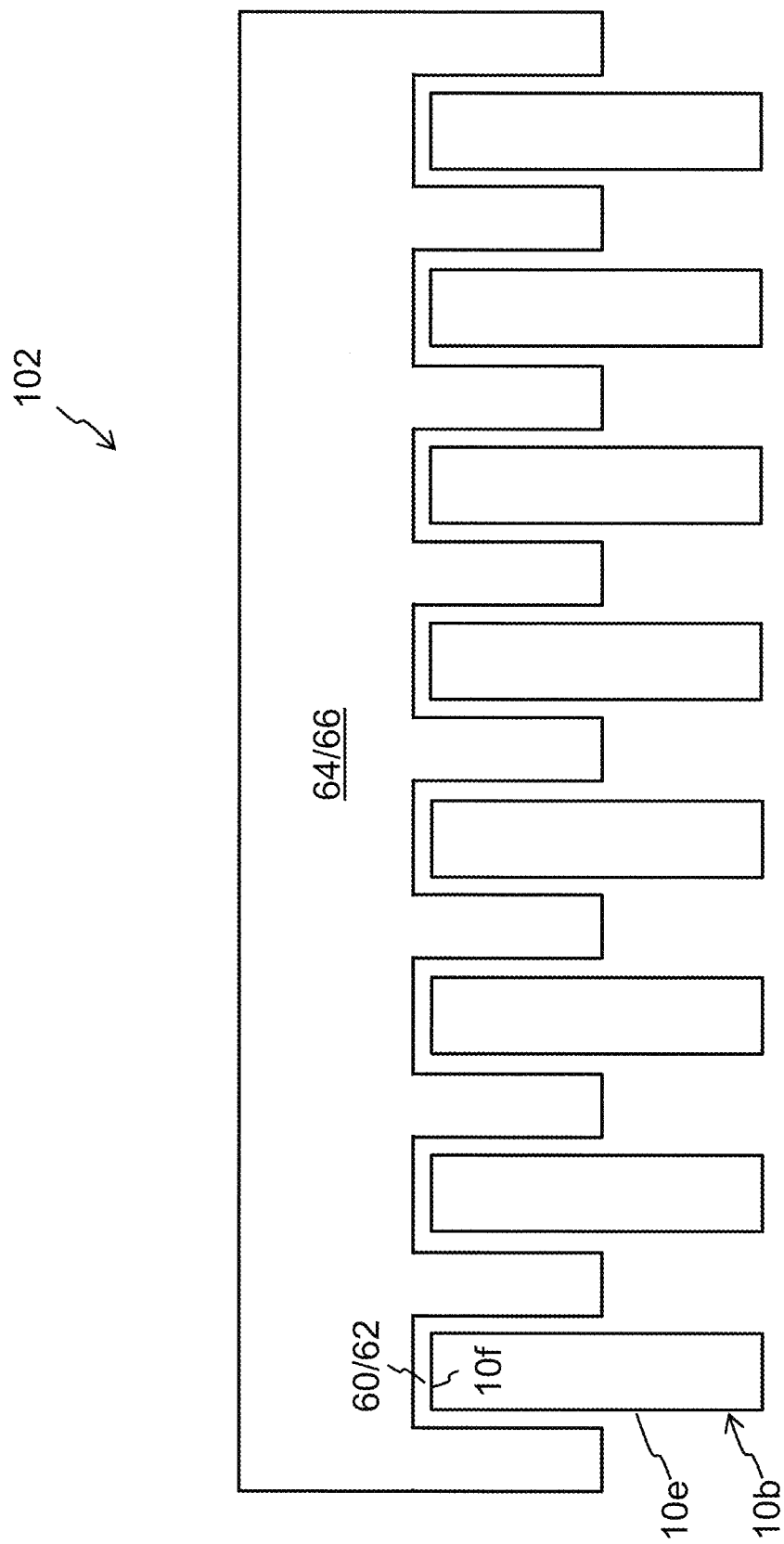

METHOD OF FORMING A DEVICE WITH FINFET SPLIT GATE NON-VOLATILE MEMORY CELLS AND FINFET LOGIC DEVICES

TECHNICAL FIELD

The present invention relates to a non-volatile flash memory cell which has a word line gate, a floating gate, and an erase gate on the same semiconductor substrate as a logic device having a logic gate.

BACKGROUND OF THE INVENTION

Split gate non-volatile flash memory cells having a word line gate, a floating gate and an erase gate are well known in the art. See for example U.S. Pat. No. 10,217,850, which is incorporated herein by reference. It is also known to form logic devices (i.e., low voltage and/or high voltage logic devices) on the same semiconductor (e.g., silicon) chip as memory devices, and in doing so sharing some of the processing steps for forming portions of both the memory and logic devices (e.g. forming gates for both memory cells and logic devices using the same polysilicon deposition process). However, other processing steps in forming the memory cells can adversely affect the previously fabricated logic devices, and vice versa, so it often can be difficult and complex to form both types of devices on the same wafer.

To solve problems with reduced channel widths by shrinking lithography size, FinFET types of structures have been proposed for memory cell structures. In a FinFET type of structure, a fin shaped member of semiconductor material connects the source to the drain regions. The fin shaped member has a top surface and two (opposing) side surfaces. Current from the source to the drain regions can then flow along the top surface as well as the two side surfaces of the fin shaped member. Thus, the effective width of the channel region is increased, thereby increasing the current flow, without a commensurate increase in the overall lateral width. Specifically, the effective width of the channel region is increased without sacrificing more semiconductor real estate by "folding" the channel region into two side surfaces, thereby reducing the "footprint" of the channel region. It is known to form FinFET logic devices on the same substrate as three gate split gate memory cells that are formed on a planar upper surface of a semiconductor substrate. See for example U.S. Pat. No. 9,985,042, which is incorporated herein by reference.

Non-volatile memory cells formed in a FinFET configuration have been disclosed. Some examples of known FinFET non-volatile memory structures include U.S. Pat. Nos. 7,423,310, 7,410,913 and 8,461,640, the entire contents of each of which is incorporated herein by reference. What these prior art references do not contemplate is an effective methodology for the contemporaneous formation of logic devices of a FinFET type configuration, and three-gate, split-gate non-volatile memory cells also of a FinFET type configuration, on the same substrate.

BRIEF SUMMARY OF THE INVENTION

The aforementioned problems and needs are addressed by a method of forming a device that includes:
providing a silicon substrate with an upper surface and having first and second areas;
removing portions of the silicon substrate in the first area of the silicon substrate to form an upwardly extending first silicon fin having a pair of side surfaces extending up and terminating at a top surface, and in the second area of the silicon substrate to form an upwardly extending second silicon fin having a pair of side surfaces extending up and terminating at a top surface;
performing a first implantation to form a first source region in the first silicon fin;
performing a second implantation to form a first drain region in the first silicon fin and to form a second source region and a second drain region in the second silicon fin, wherein the first source region and the first drain region define a first channel region of the first silicon fin extending there between, and wherein the second source region and the second drain region define a second channel region of the second silicon fin extending there between;
forming a floating gate disposed over and insulated from a first portion of the first channel region using a first polysilicon deposition, wherein the floating gate wraps around the top and side surfaces of the first silicon fin;
forming an erase gate disposed over and insulated from the first source region, and a word line gate disposed over and insulated from a second portion of the first channel region, and a dummy gate disposed over and insulated from the second channel region, using a second polysilicon deposition, wherein:
  the erase gate wraps around the top and side surfaces of the first silicon fin,
  the word line gate wraps around the top and side surfaces of the first silicon fin,
  the dummy gate wraps around the top and side surfaces of the second silicon fin;
  and
  replacing the dummy gate with a metal gate that is disposed over and insulated from the second channel region, wherein the metal gate wraps around the top and side surfaces of the second silicon fin.

A method of forming a device includes:
providing a silicon substrate with an upper surface and having first and second areas;
removing portions of the silicon substrate in the first area of the silicon substrate to form a plurality of upwardly extending first silicon fins each having a pair of side surfaces extending up and terminating at a top surface, and in the second area of the silicon substrate to form a plurality of upwardly extending second silicon fins each having a pair of side surfaces extending up and terminating at a top surface;
performing a first implantation to form a first source region in each of the first silicon fins;
performing a second implantation to form a first drain region in each of the first silicon fins and to form a second source region and a second drain region in each of the second silicon fins, wherein for each of the first silicon fins the first source region and the first drain region define a first channel region of the first silicon fin extending there between, and wherein for each of the second silicon fins the second source region and the second drain region define a second channel region of the second silicon fin extending there between;
forming a plurality of floating gates each disposed over and insulated from a first portion of one of the first channel regions using a first polysilicon deposition, wherein each of the floating gates wraps around the top and side surfaces of one of the first silicon fins;
forming a plurality of erase gates each disposed over and insulated from one of the first source regions, and a plurality of word line gates each disposed over and insulated from a second portion of one of the first channel regions, and a plurality of dummy gates each disposed over and insulated from one of the second channel regions, using a second polysilicon deposition, wherein:

each of the erase gates wraps around the top and side surfaces of one of the first silicon fins,
    each of the word line gates wraps around the top and side surfaces of one of the first silicon fins,
    each of the dummy gates wraps around the top and side surfaces of one of the second silicon fins; and
    replacing each of the dummy gates with a metal gate that is disposed over and insulated from one of the second channel regions, wherein each of the metal gates wraps around the top and side surfaces of one of the second silicon fins.

Other objects and features of the present invention will become apparent by a review of the specification, claims and appended figures.

BRIEF DESCRIPTION OF THE DRAWINGS

FIGS. 2-5 are side cross sectional views of memory cells in the memory cell area of the semiconductor substrate.

FIGS. 6-7 are side cross sectional views of a logic device in the logic device area of the semiconductor substrate.

DETAILED DESCRIPTION OF THE INVENTION

Figure 1B:
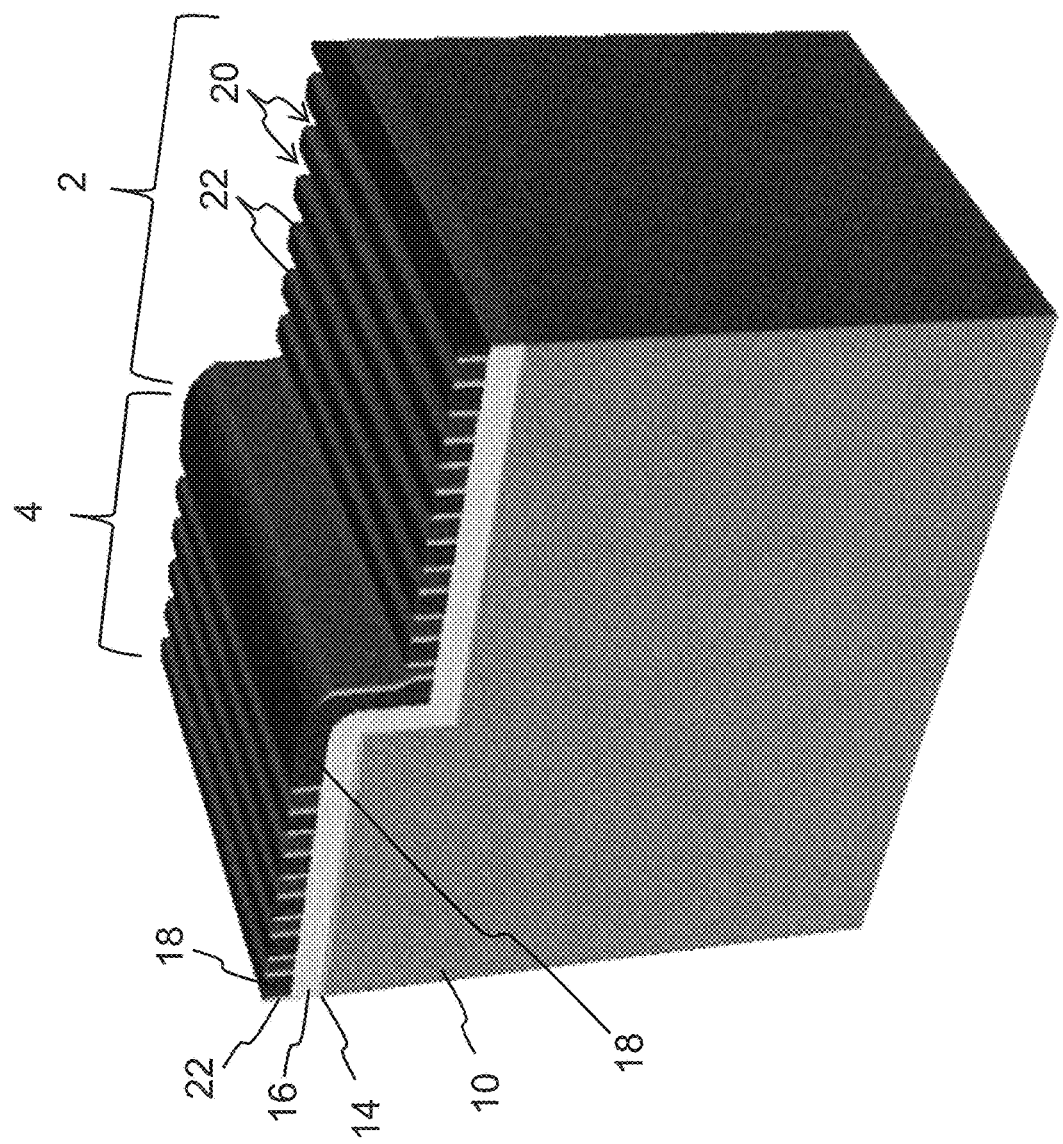
FIGS. 1A-1Q are perspective cross sectional views showing steps in forming non-volatile memory cells and logic devices on a semiconductor substrate.
Figure 1C:
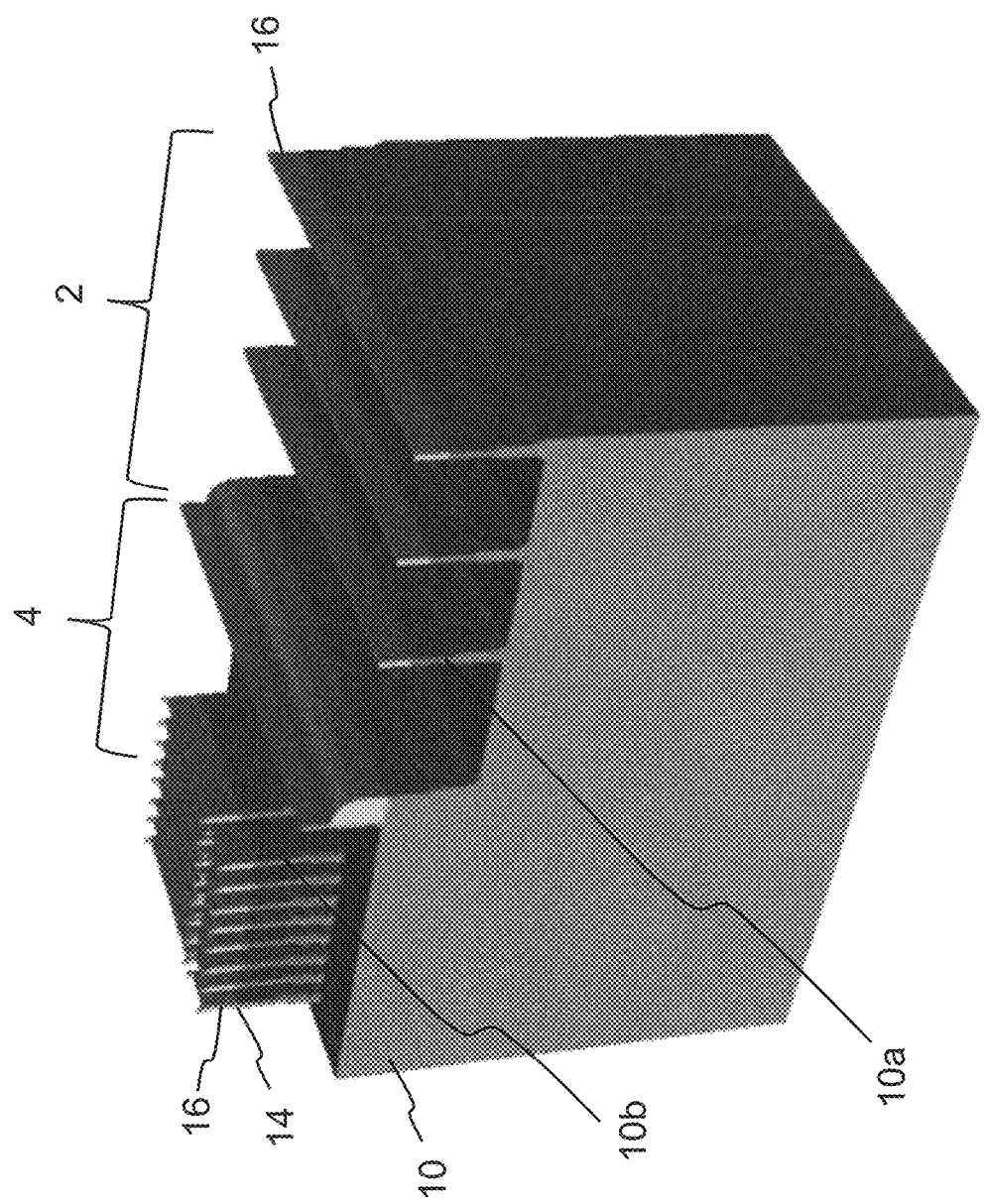
Figure 1D:
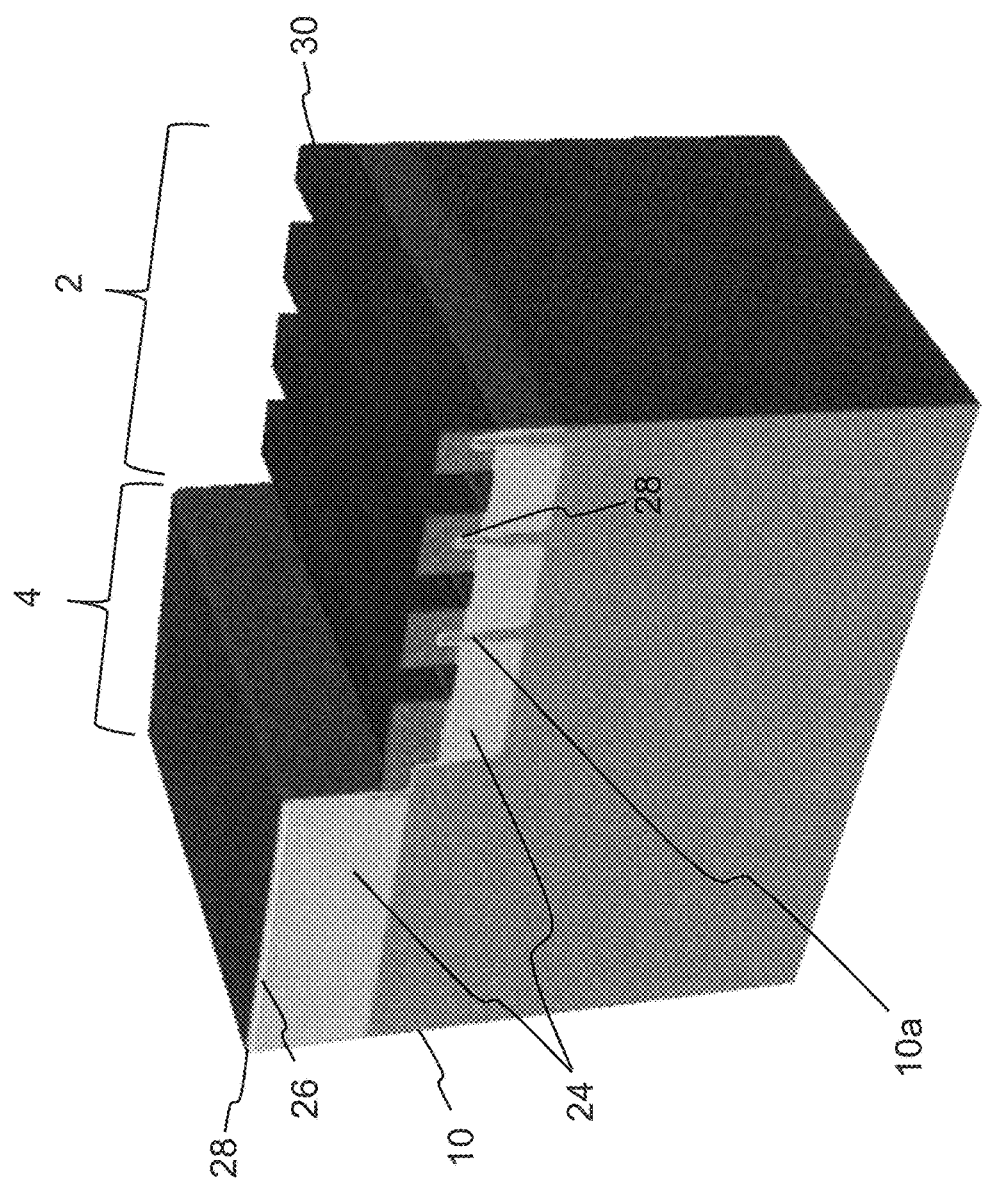
Figure 1E:
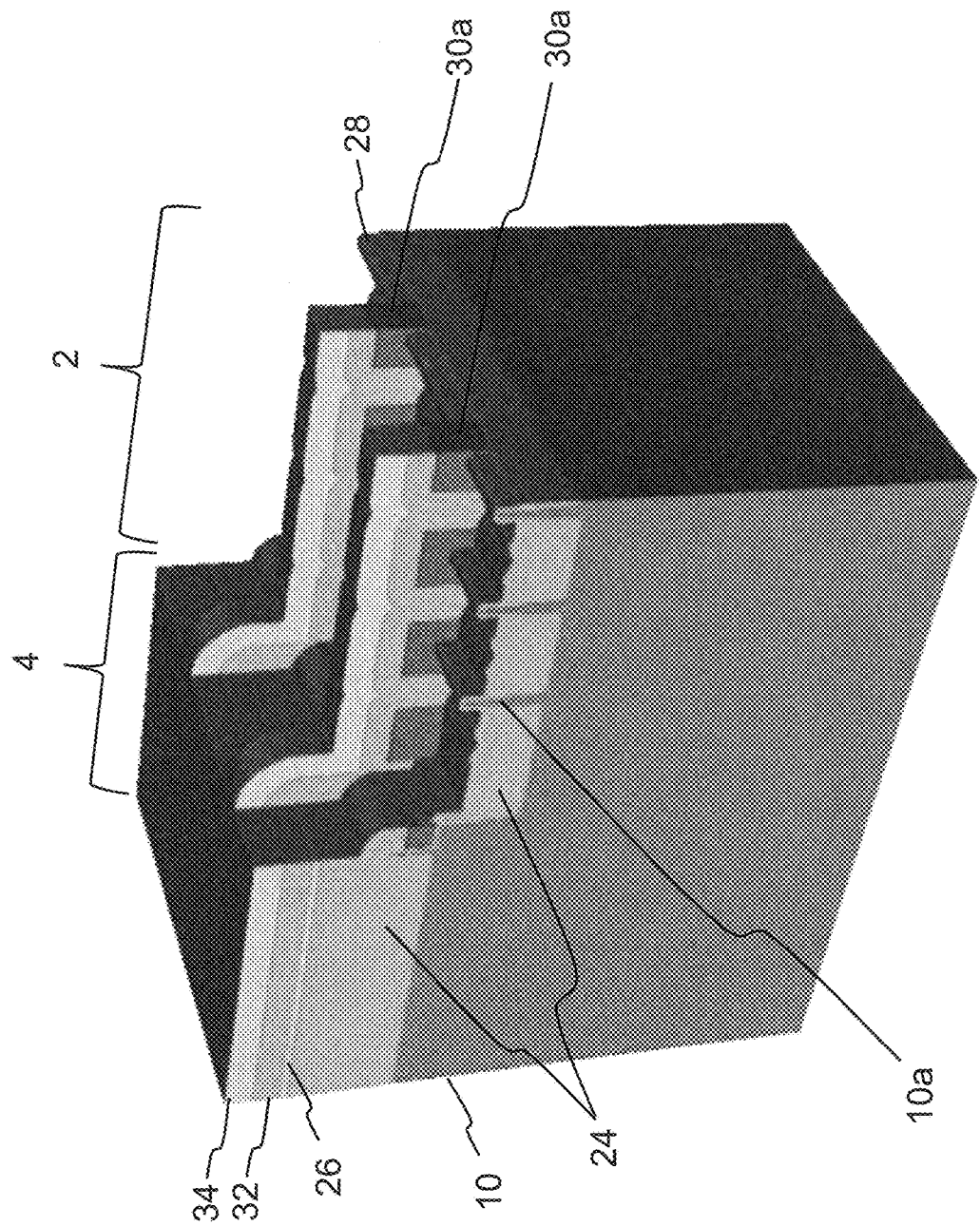
Figure 1F:
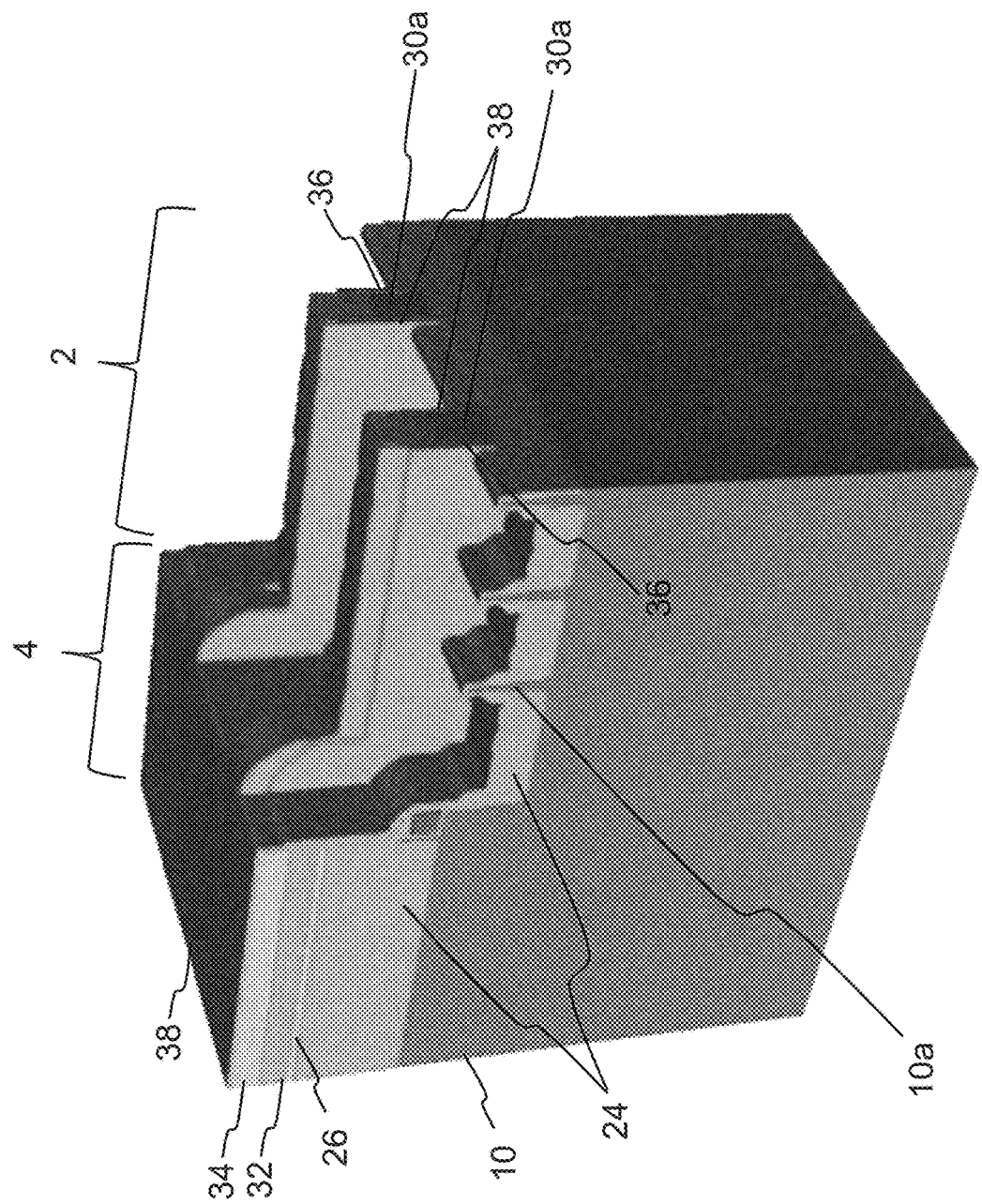
Figure 1G:
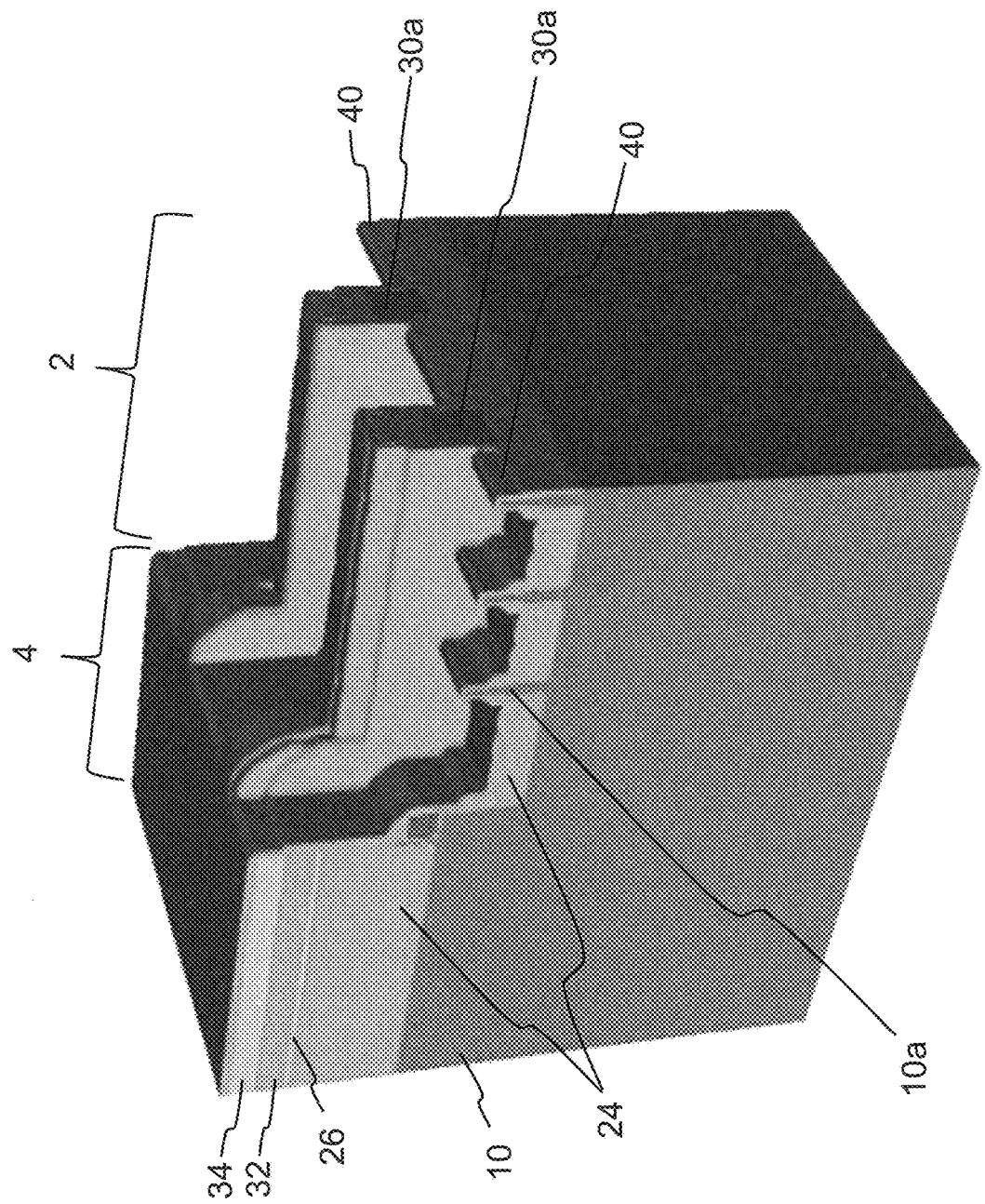
Figure 1H:
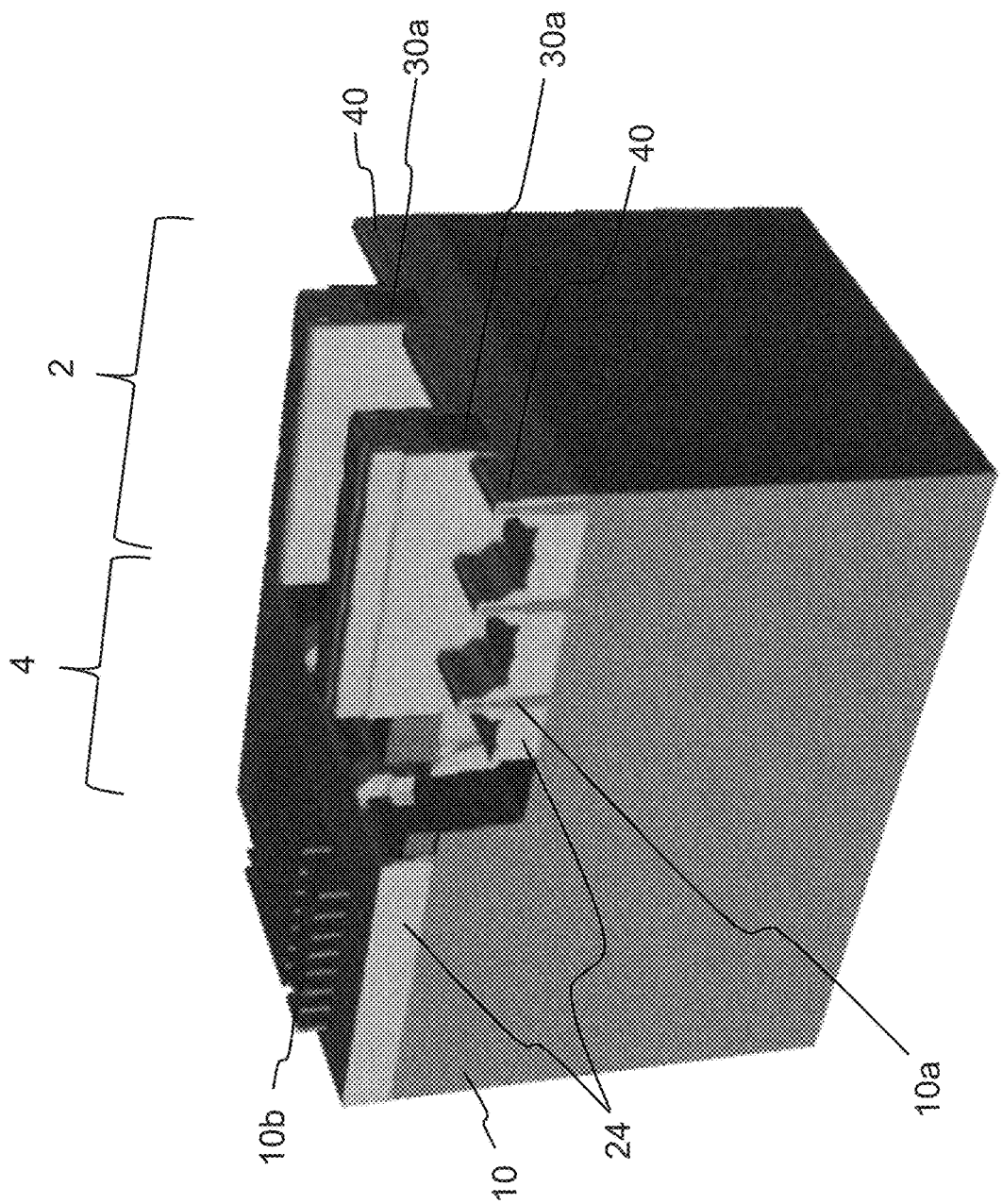
Figure 1I:
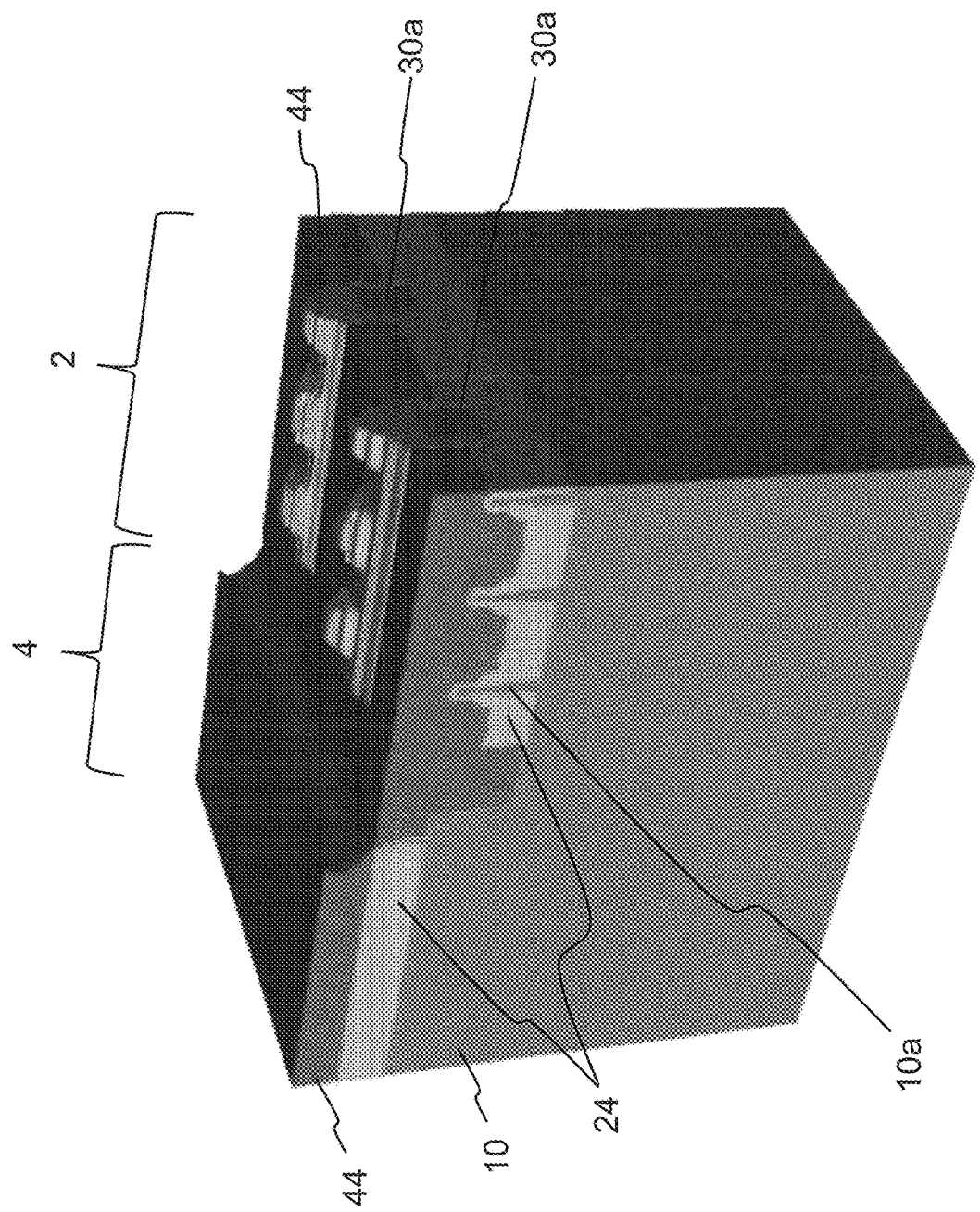
Figure 1J:
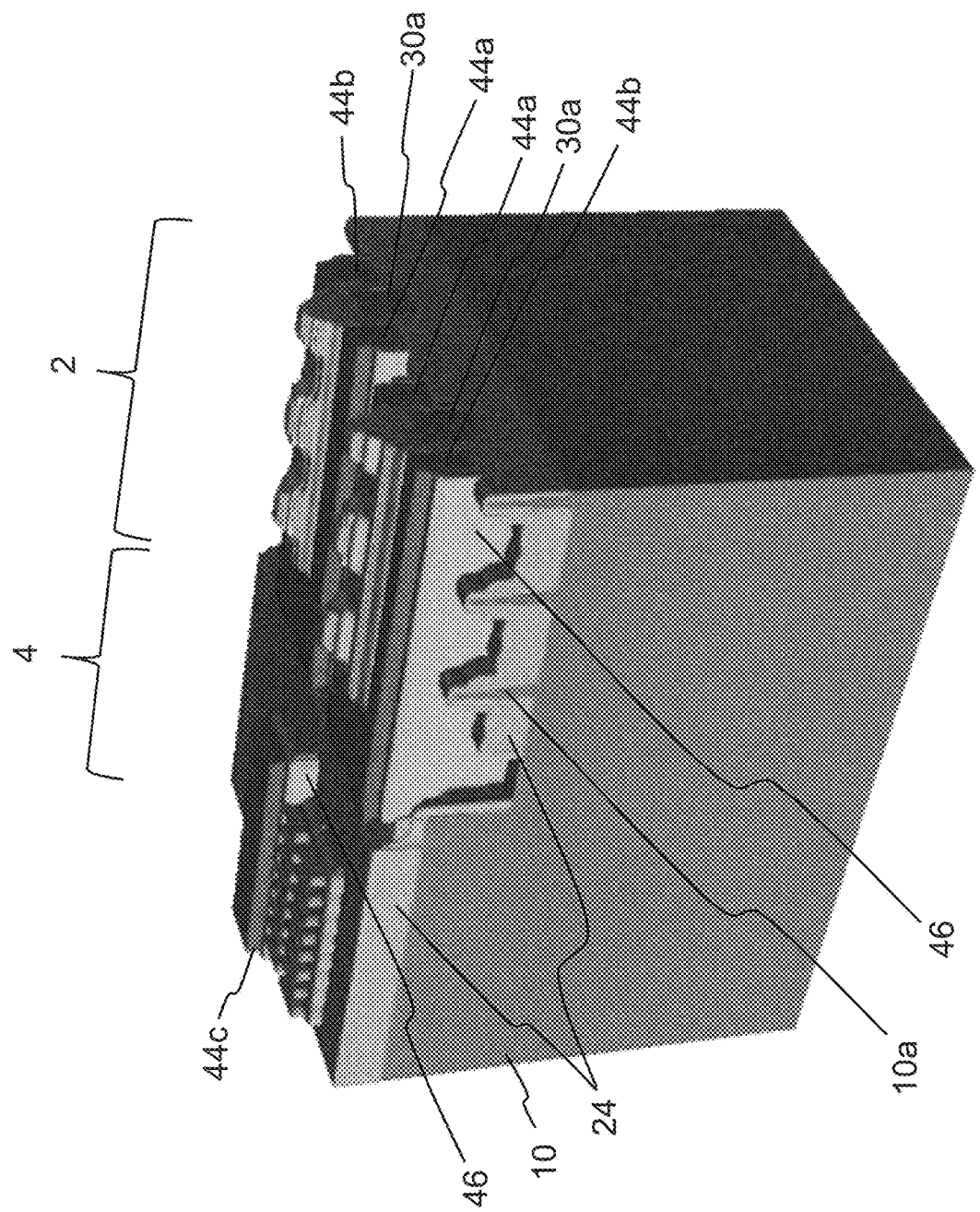
Figure 1K:
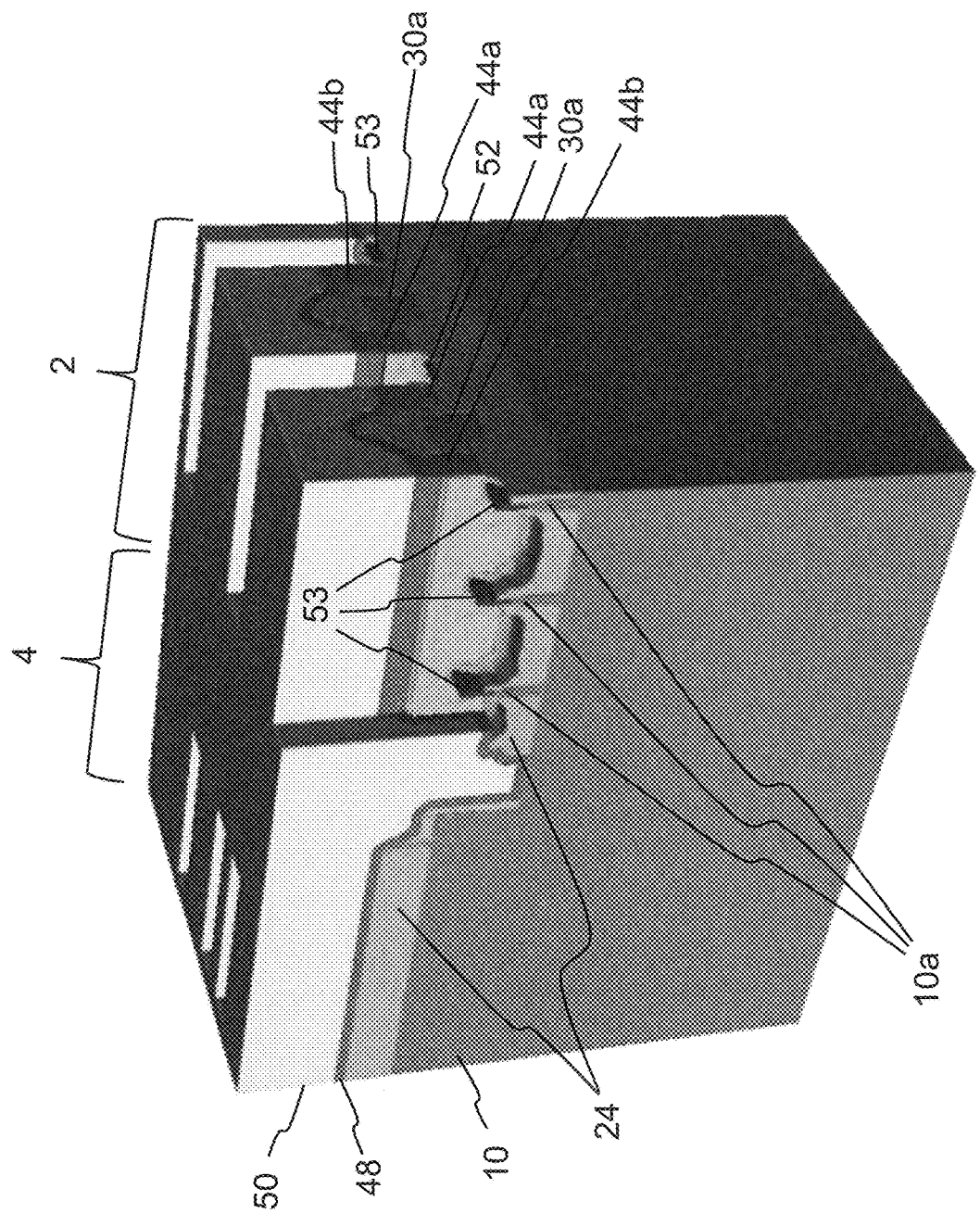
Figure 1L:
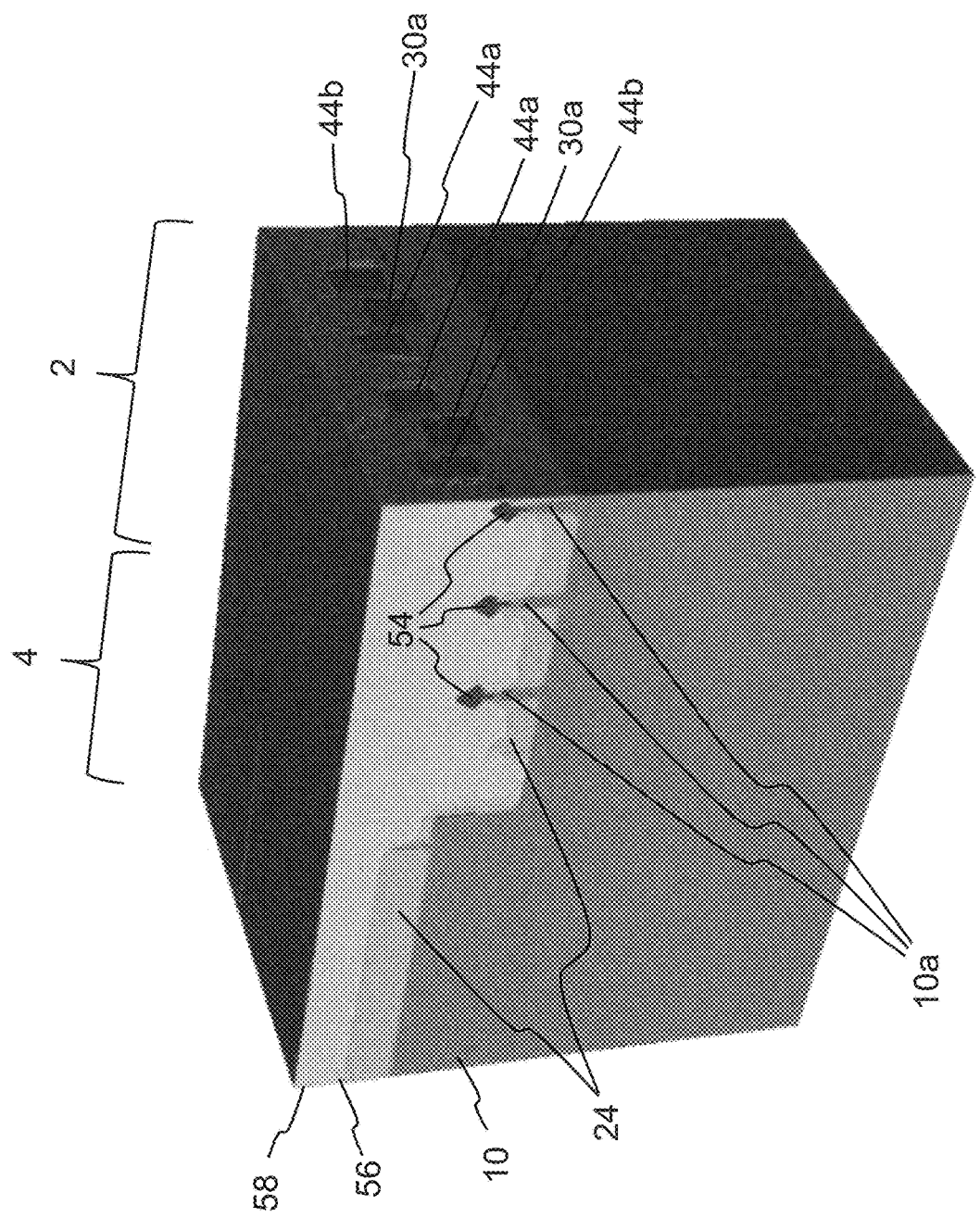
Figure 1M:
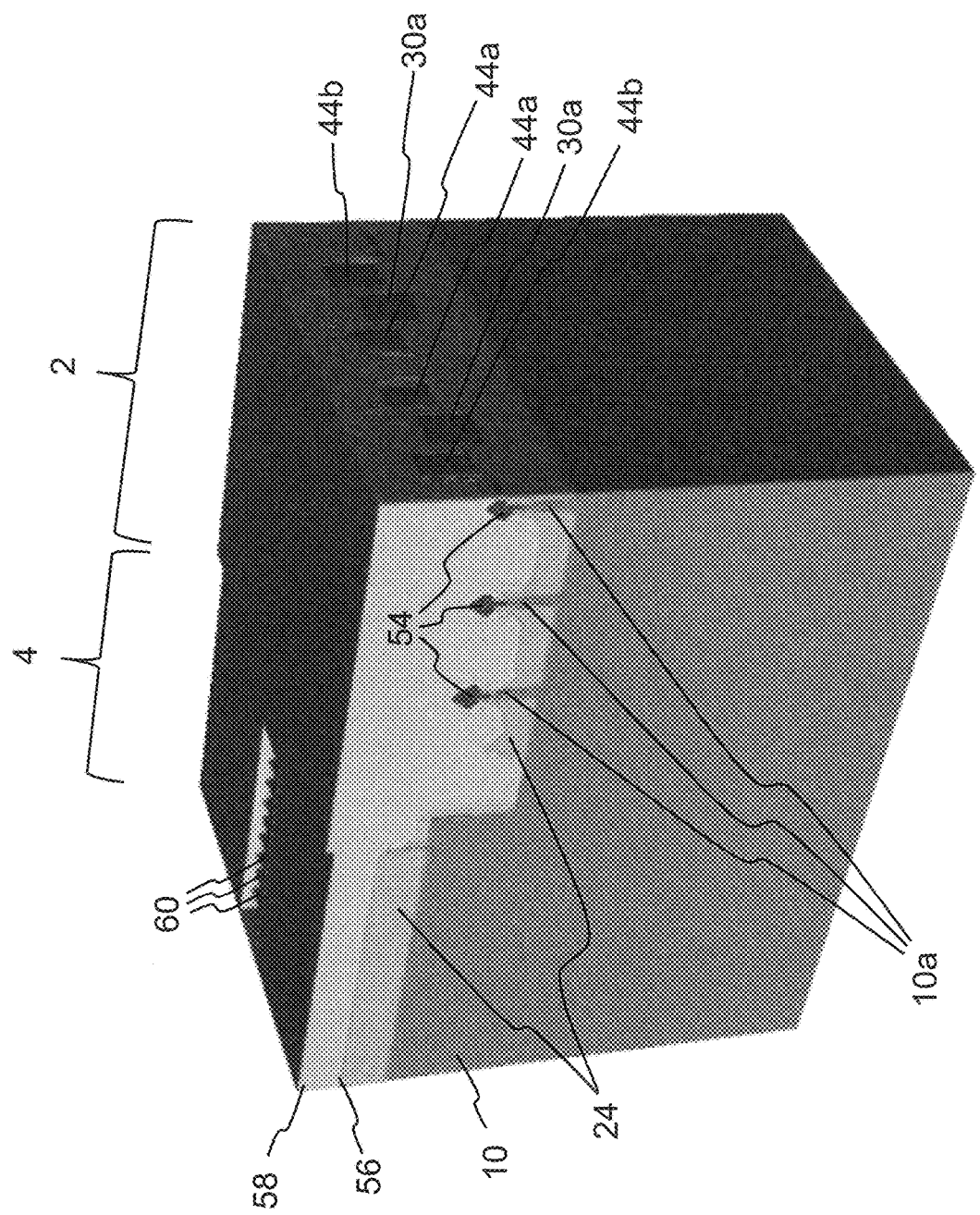
Figure 1N:
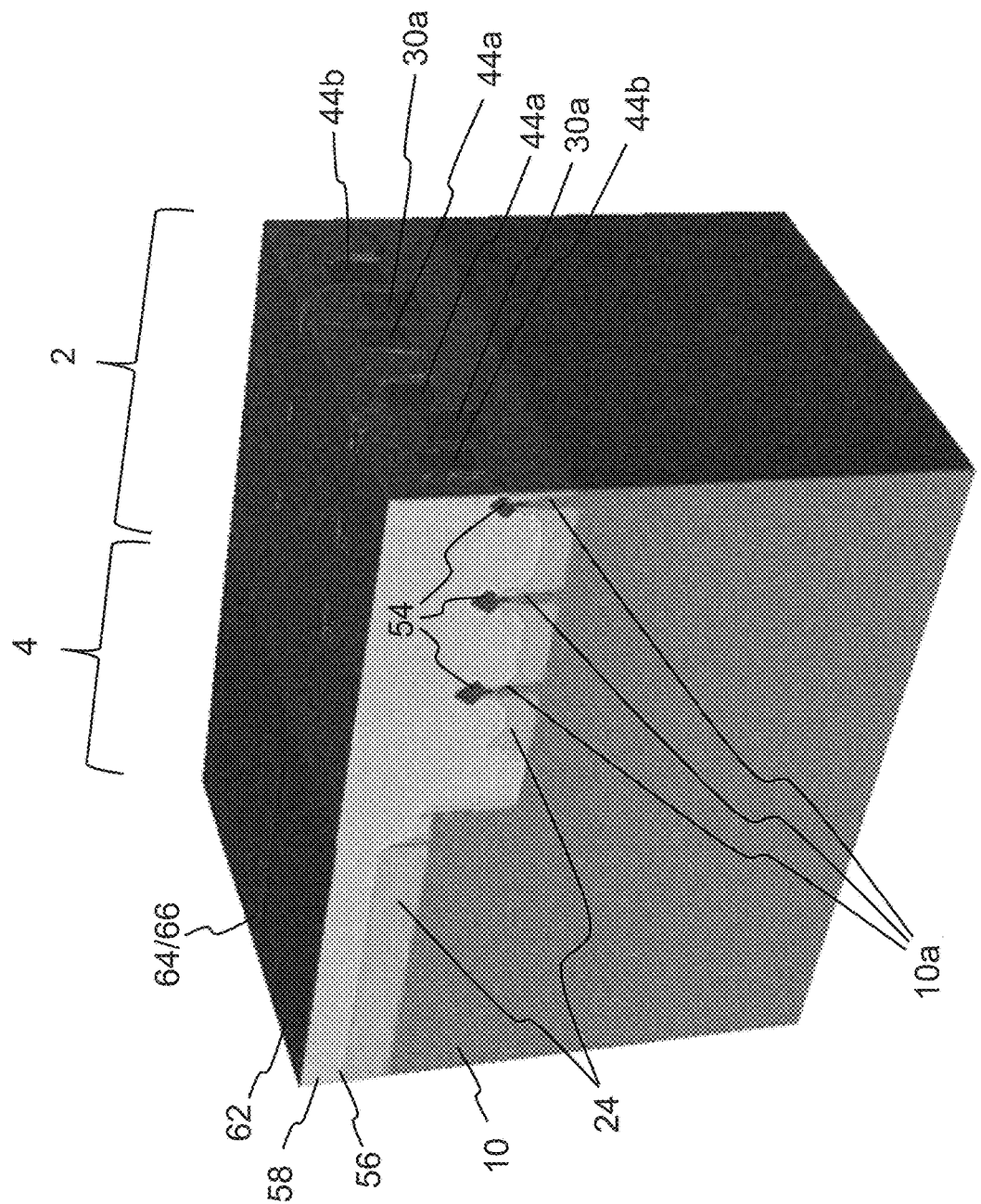
Figure 10:
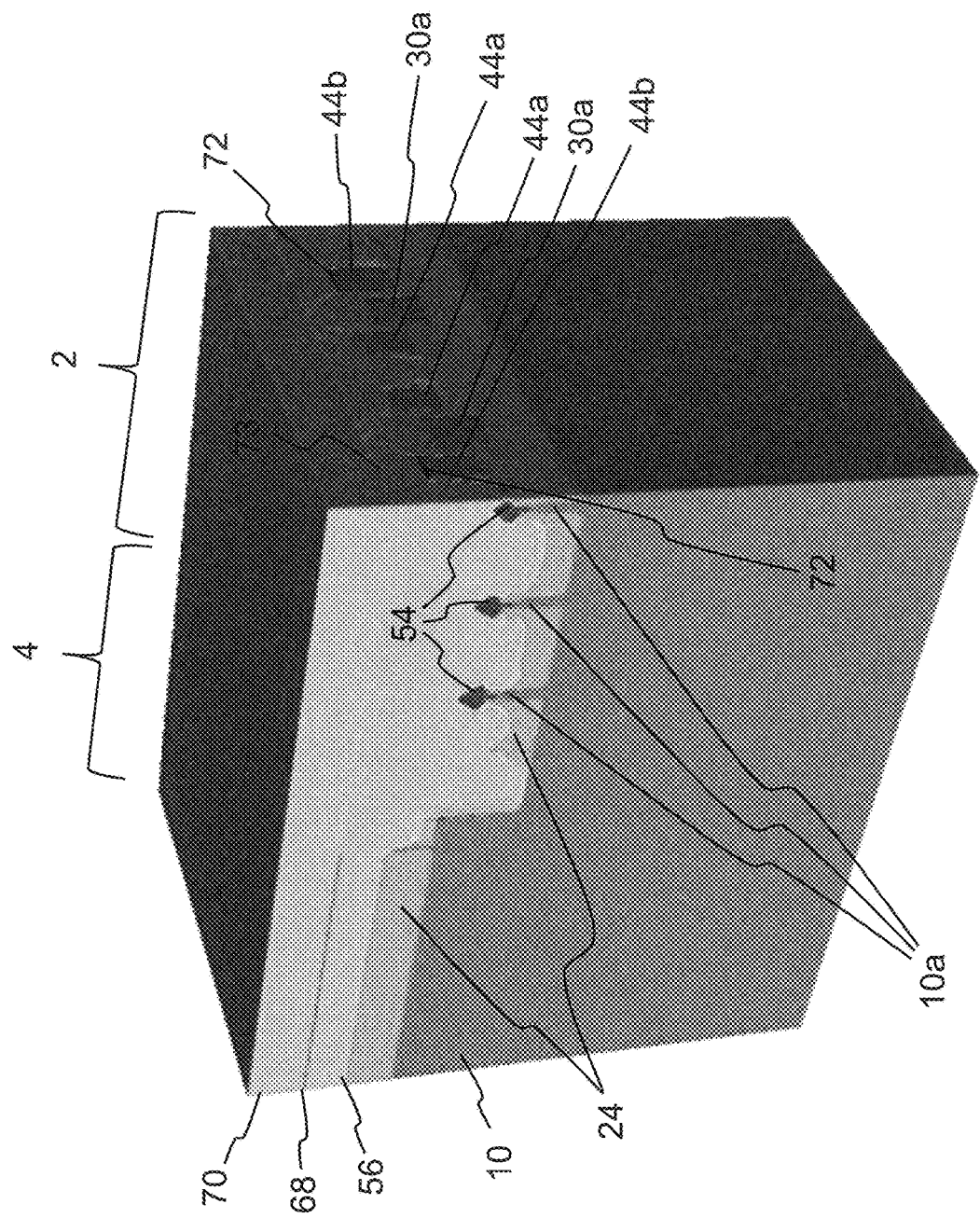
Figure 1P:
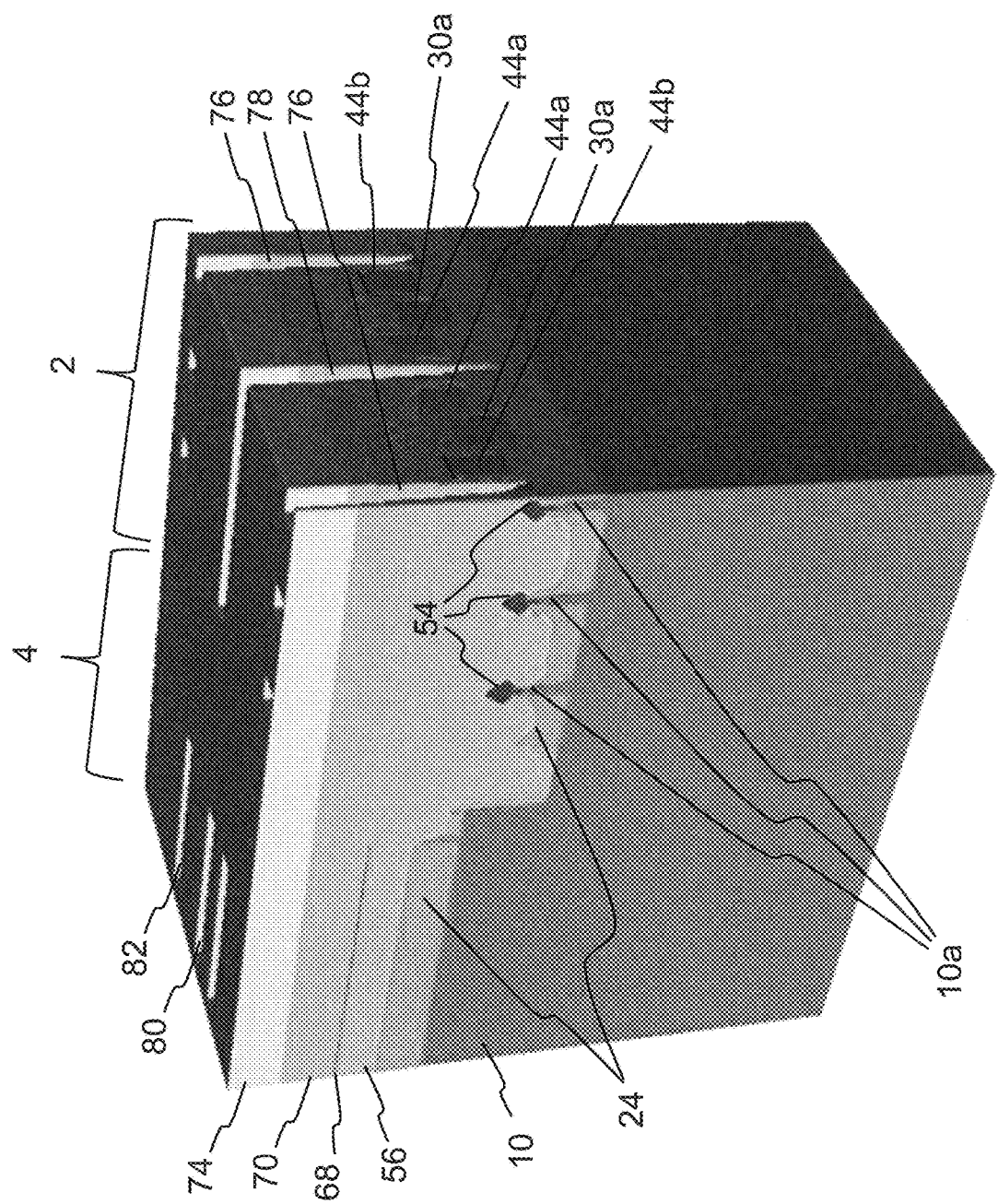
Figure 1Q:
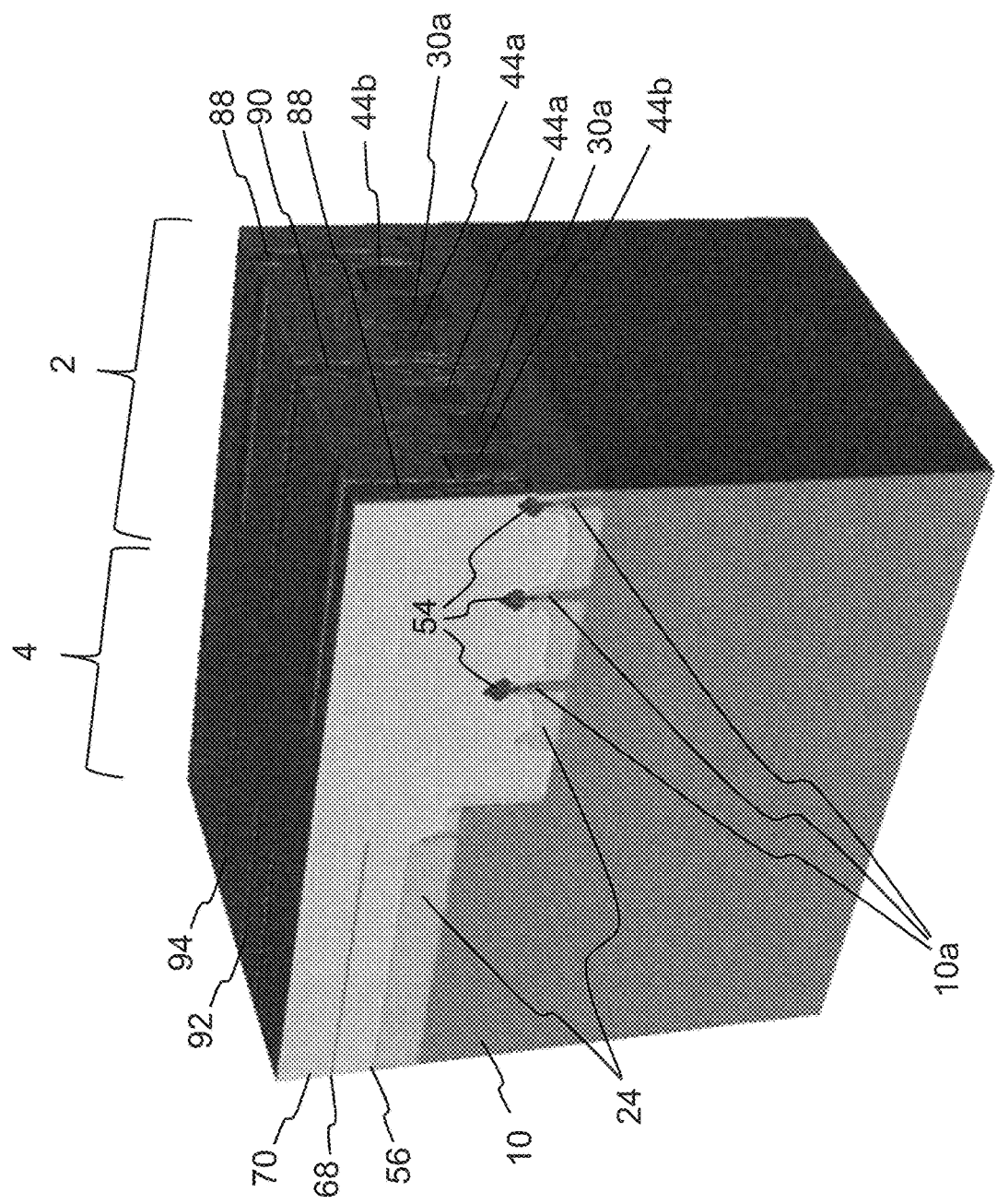

Referring to FIGS. 1A-1Q, there are shown perspective cross-sectional views of steps in the process of making pairs of memory cells in a memory cell area 2 of a semiconductor wafer substrate (also referred to as substrate) 10, and logic devices in a logic device area 4 of the substrate 10. The process begins by forming a layer of silicon dioxide 12 (also referred to as oxide) on the upper surface 11 of the semiconductor substrate 10, where semiconductor substrate 10 may be formed of P type single crystalline silicon. Oxide layer 12 can be formed by deposition or by thermal oxidation. A photolithography masking process is then used to pattern the oxide layer 12 (i.e. selectively remove some portions of the layer but not others). The photolithography masking process includes coating photoresist material on the oxide layer 12, which is followed by exposing and developing the photoresist to remove the photoresist material from the memory cell area 2 while maintaining the photoresist in the logic device area 4. An oxide etch is then used to remove the exposed portions of oxide layer 12 from the memory cell area 2 leaving the substrate 10 exposed (the photoresist protects oxide layer 12 from the etch in the logic device area 4). A silicon etch is used to recess the exposed upper surface of the substrate 10 in the memory cell area 2. Oxide layer 12 and the photoresist protect the logic device area 4 from this silicon etch. The resulting structure is shown in FIG. 1A (after photoresist removal), where the upper surface of the substrate 10 in the memory cell area 2 is recessed below the upper surface of the substrate 10 in the logic device area 4 by a recess amount R.

An oxide layer 14 is formed on the structure. A silicon nitride ("nitride") layer 16 is formed on oxide layer 14. An insulation layer 18 (e.g., amorphous carbon) is formed on nitride layer 16. The insulation layer 18 is patterned by forming photoresist, selectively removing strips of the photoresist in the memory cell and logic device areas 2/4, and removing the underlying exposed portions of the insulation layer 18 to form trenches 20 in the insulation layer 18 that extend down to and expose the underlying nitride layer 16. After the photoresist is removed, oxide spacers 22 are then formed in the trenches 20. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (often with a rounded upper surface). In the present case, oxide spacers 22 are formed along the sidewalls of trenches 20, as shown in FIG. 1B.

Portions of the oxide spacers 22 in trenches 20 are removed by covering the structure with photoresist followed by partial photoresist removal so that portions of the oxide spacers 22 are exposed (e.g., certain spacers 22 in the memory cell area 2 are left entirely exposed, while only portions of each spacer 22 in the logic device area 4 are left exposed). The exposed portions of the spacers 22 are then removed by oxide etch, leaving segments of the spacers 22 in trenches 20. After photoresist removal, the remaining portions of insulation layer 18 are removed by a respective etch, e.g. a carbon etch. A nitride etch is then used to remove the exposed portions of nitride layer 16 (i.e., all but the portions of nitride layer 16 underneath the remaining oxide spacers 22), followed by an oxide etch to remove exposed portions of oxide layer 14 and the remaining oxide spacers 22). A silicon etch is then used to recess the exposed surface portions of the substrate 10, forming fins 10a of the silicon substrate in the memory cell area 2 and fins 10b of the silicon substrate in the logic device area 4, as shown in FIG. 1C. Fins 10a and 10b have the same height relative to bulk silicon underneath, but fins 10b extend vertically higher than fins 10a by the recess amount R.

The structure is covered in a thick layer of oxide (i.e., STI oxide) 24, which is then planarized (e.g., by chemical mechanical polish—CMP) to expose the top surface of nitride layer 16 in the logic device area 4. A nitride layer 26 is formed over planarized oxide layer 24. Photoresist is formed over nitride layer 26, and removed from the memory cell area 2. Etches are used to remove the exposed nitride layers 26/16 and oxide layer 14, and recess oxide layer 24 below to the tops of silicon fins 10a in the memory cell area 2. After photoresist removal, an oxide layer 28 is formed on the structure. A polysilicon ("poly") layer 30 is formed on the oxide layer 28 by a first polysilicon deposition. A chemical mechanical polish is used to planarize the poly layer 30, using the oxide layer 28 as a stop layer, which removes poly layer 30 from the logic device area 4. A poly etch back is used to recess poly layer 30 in the memory cell area 2. The poly layer 30 is then patterned (photoresist formation, exposure, and partial removal, followed by poly etch), so that strips of the poly layer 30 remain, each extending along the top and sidewalls of one of the fins 10a in the memory cell area 2, as shown in FIG. 1D.

An oxide layer 32 is formed over the structure, and a nitride layer 34 is formed over oxide layer 32. Photoresist is formed over the structure, and partially removed from the memory cell area 2, leaving strip portions of the nitride layer 34 extending across the fins 10a in memory cell area 2 exposed. A nitride etch is used to remove the exposed portions of nitride layer 34, and an oxide etch is used to remove exposed portions of oxide layer 32, exposing portions of poly layer 30 in memory cell area 2. A poly etch is used to remove the exposed portions of poly layer 30, leaving blocks 30a of the poly layer 30 in the memory cell area 2, as shown in FIG. 1E (after photoresist removal).

Oxide spacers 36 are then formed by oxide deposition and anisotropic etch, to cover the sidewalls of poly blocks 30a. Photoresist is formed over the structure, and partially removed to expose portions of the memory cell area 2 (i.e., the area between adjacent poly blocks 30a on the same fin 10a). An implantation process is performed to form source regions 52 in the fins 10a between the adjacent poly blocks 30a. An isotropic oxide etch is used to remove oxide spacers 36 on the exposed sidewalls of poly blocks 30a (i.e., those sidewalls facing each other of adjacent poly blocks 30a on the same fin 10a). After photoresist removal, a layer of oxide (tunnel oxide) 38 is formed on the exposed sidewalls of poly blocks 30a (e.g., by high temperature oxidation—HTO). The resulting structure is shown in FIG. 1F (except source regions 52, which are better shown in FIGS. 1K and 2). At this stage, for adjacent poly blocks 30a on the same fin 10a, sidewalls facing each other are covered by tunnel oxide layer 38 and sidewalls facing away from each other are covered by oxide spacers 36.

Photoresist is formed over the structure, and partially removed to expose portions of the memory cell area 2 (i.e., for adjacent poly blocks 30a on the same fin 10a, the area around sidewalls facing away from each other are exposed, leaving oxide spacers 36 exposed). An implantation process is performed to implant material into the portions of fins 10a adjacent oxide spacers 36 on sidewalls of poly blocks 30a. These implanted areas of fins 10a will eventually be disposed underneath the word line gates which are formed later. An oxide etch is then used to remove oxide from, and to leave exposed, top and side surface portions of the fins 10a that were just implanted. After photoresist removal, an oxide layer 40 (word line oxide) is formed on the exposed top and side surfaces of fins 10a, as shown in FIG. 1G.

Photoresist is formed over the structure, and removed from the logic device area 4. A series of etches are performed to remove the oxide and nitride layers down to the STI oxide layer 24, and to recess oxide layer 24, so that fins 10b protrude and are partially exposed in the logic device area 4, as shown in FIG. 1H (after photoresist removal). An oxide layer (not shown) is then formed to cover the exposed top and side surfaces of fins 10b in the logic device area 4. A poly layer 44 is then formed over the structure by a second poly deposition. The poly layer 44 is planarized by CMP (using nitride layer 34 or the oxide on nitride layer 34, over the poly blocks 30a in the memory cell area, as a CMP stop layer). Photoresist is formed on the structure and removed from the memory cell area 2. An isotropic poly etch is used to recess the poly layer 44 in the memory cell area 2. The resulting structure is shown in FIG. 1I (after photoresist removal).

Photoresist is formed over the structure, and selectively removed leaving strips of photoresist extending across the fins 10a/10b in both the memory cell and logic device areas 2/4. A poly etch is used to remove exposed portions of poly layer 44 (except for those portions under the strips of photoresist). After photoresist removal, spacers 46 are formed on the sides of poly layer 44 by deposition and anisotropic etch. Spacers 46 are preferably formed of a low K material such as SiON. The resulting structure is shown in FIG. 1J. In the memory cell area 2, strips 44a/44b of poly layer 44 remain, each extending across the fins 10a and laterally adjacent to poly blocks 30a (i.e., poly blocks 30a are between strips 44a and 44b). In the logic device area, strips 44c of poly layer 44 remain, each extending across fins 10b (only one set of fins 10b and one strip 44c are shown for simplicity).

An isotropic etch is used to expose fins 10b adjacent poly strip 44c in the logic device area 4. A hard mask layer 48 (e.g., SiCN) is formed over the structure. Photoresist 50 is formed on the structure and patterned to selectively expose portions of the hard mask layer 48 between adjacent poly strips 44a and adjacent poly strips 44b in the memory cell area 2, and portions of the hard mask layer 48 adjacent poly strip 44c in the logic device area 4. Etches are used to remove the exposed portions of hard mask layer 48 and oxide layer 40 in the memory cell area 2, exposing portions of fins 10a between poly strips 44a and adjacent poly strips 44b. These etches also remove exposed portions of hard mask layer 48 and oxide (previously not shown) on fins 10b on both sides of poly strip 44c in the logic device area 4. An implantation is then performed into the exposed portions of fins 10a in memory cell area 2 to form drain regions 53 therein (and to enhance source regions 52). This implantation also forms source and drain regions 52L and 53L in fins 10b on opposing sides of poly strip 44c in the logic region 4. The resulting structure is shown in FIG. 1K (except for source/drain regions 52L/53L, which are better shown in FIG. 4).

After photoresist 50 is removed, an epitaxial layer 54 is grown on the exposed source and drain regions 52/53 of fins 10a in the memory cell area 2, and on the exposed source and drain regions 52L/53L of fins 10b in the logic device area 4. Epitaxial layer 54 expands the size of source/drain regions (for easier contact formation and reliability) and increases carrier mobility in the fins 10a/10b for better conduction. The remaining portions of hard mask layer 48 are then removed by etch. The structure is then covered by a layer of nitride 56. A thick layer of oxide 58 is formed over the structure, and planarized by CMP. The resulting structure is shown in FIG. 1L.

Photoresist is formed over the structure, and selectively removed from the logic device area 4. An oxide etch is used to expose poly strips 44c. A poly etch is then used to remove poly strips 44c from logic device area 4. After photoresist removal, an oxide etch is used to remove the oxide on the fins 10b which was previously under poly strips 44c, leaving portions of the fins 10b in logic device area 4 exposed. An oxide layer 60 is then formed which covers the exposed fins 10b in logic device area 4, as shown in FIG. 1M. A layer of high K material 62 (i.e. having a dielectric constant K greater than that of oxide, such as HfO2, ZrO2, TiO2, Ta2O5, or other adequate materials) is formed on the structure (namely on oxide layer 60). One or more metal layers are then formed on the structure. For example, a TiN layer 64 is formed on the structure, followed by a thick layer of tungsten 66, followed by CMP using the high K layer 62 in the logic device area 4 as the stop layer. The resulting structure is shown in FIG. 1N, where strips of metal 64/66 in the logic device area 4 extend across fins 10b (effectively replacing dummy poly strip 44c which was previously removed).

A nitride layer 68 is formed over the structure, and an oxide layer 70 is formed on nitride layer 68. Photoresist is formed over the structure, and patterned so as to expose portions of oxide layer 70 over poly strips 44b in memory cell area 2. Etches are performed to remove portions of oxide layer 70, nitride layer 68 and oxide layer 50 over, and expose the tops of, poly strips 44b. After photoresist removal, salicide 72 is formed on the top surface of poly strips 44b by Ti/Pt deposition and anneal. Any excessive Ti is removed by Ti etch, if required. Oxide 73 is deposited to fill in the area over salicide 72. The resulting structure is shown in FIG. 1O.

Photoresist 74 is formed over the structure, and patterned to remove portions of the photoresist 74 vertically over source/drain regions 52/53 in the memory area 2, and vertically over the source/drain regions 52L/53L in the logic device area 4. Contact holes are then formed where the photoresist 74 was removed by a series of etches that extend down to and expose respective source or drain regions. Specifically, contact holes 76 in the memory cell area 2 each extend down to and expose one of the drain regions 53. Contact hole 78 (only one shown for simplicity) in the memory area 2 extends down to and exposes the source regions 52. Contact hole 80 in the logic device area 4 extends down to and exposes the source regions 52L. Contact hole 82 in the logic device area 4 extends down to and exposes the drain regions 53L. The resulting structure is shown in FIG. 1P.

After photoresist 74 is removed, a layer of TiN 84 is deposited on the structure, and a layer of tungsten 86 is deposited on TiN layer 84. A CMP is used to remove layers 84/86, except for in contact holes 76/78/80/82. Layers 84/86 in contact holes 76 form drain contacts 88 that extend down to and make electrical contact with drain regions 53. Layers 84/86 in contact hole 78 form source contact 90 that extends down to and makes electrical contact with source regions 52. Layers 84/86 in contact hole 80 form source contact 92 that extends down to and makes electrical contact with source regions 52L. Layers 84/86 in contact hole 82 form drain contact 94 that extends down to and makes electrical contact with drain regions 53L. The final structure is shown in FIG. 1Q. Further contact processing may be implanted to further extend and route the contacts 88/90/92/94.

Figure 5:
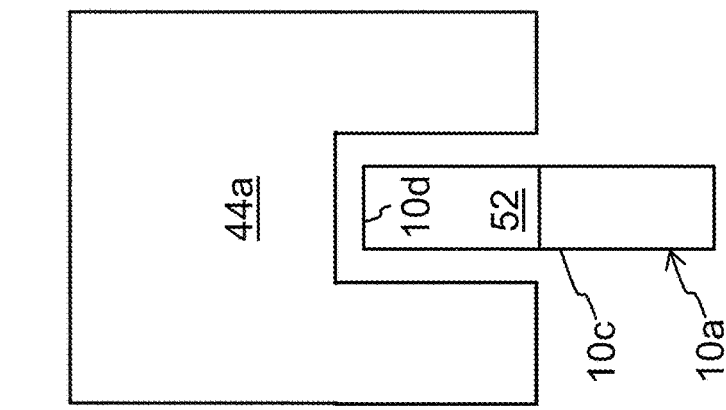
Figure 4:
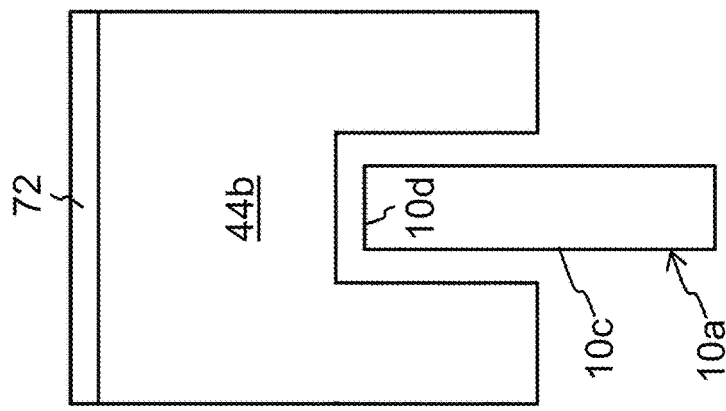
Figure 3:
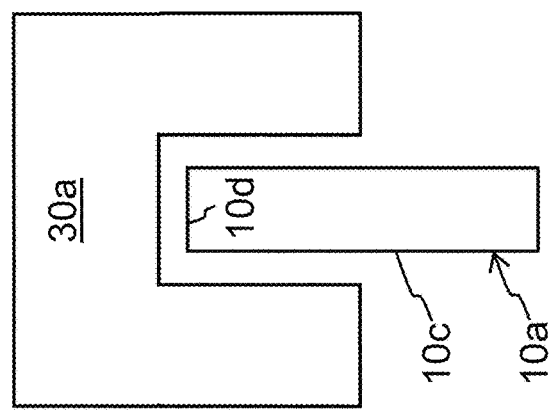

FIG. 2 shows a pair of the memory cells 100 formed along one of the fins 10a in the memory cell area 2, although it should be appreciated that additional pairs of memory cells are formed end to end on each fin 10a. Each memory cell 100 includes a source region 52 and a drain region 53, which define a channel region 96 of the semiconductor substrate there between. The channel region 96 extends along the top and side surfaces 10c and 10d of the fin 10a between the source and drain regions 52/53. Poly block 30a is the floating gate which wraps around and is insulated from the top and side surfaces 10c and 10d of the fin 10a, for controlling the conductivity of a first portion of the channel region 96, as best shown in FIG. 3. Similarly, poly block 44b is the word line gate which wraps around and is insulated from the top and side surfaces 10c and 10d of the fin 10a, for controlling the conductivity of a second portion of the channel region 96, as best shown in FIG. 4. Finally, poly block 44a is the erase gate which wraps around and is insulated from the source region 52 of the fin 10a, as best shown in FIG. 5. Drain contacts 88 and source contact 90 are further shown in FIG. 2.

Figure 6:
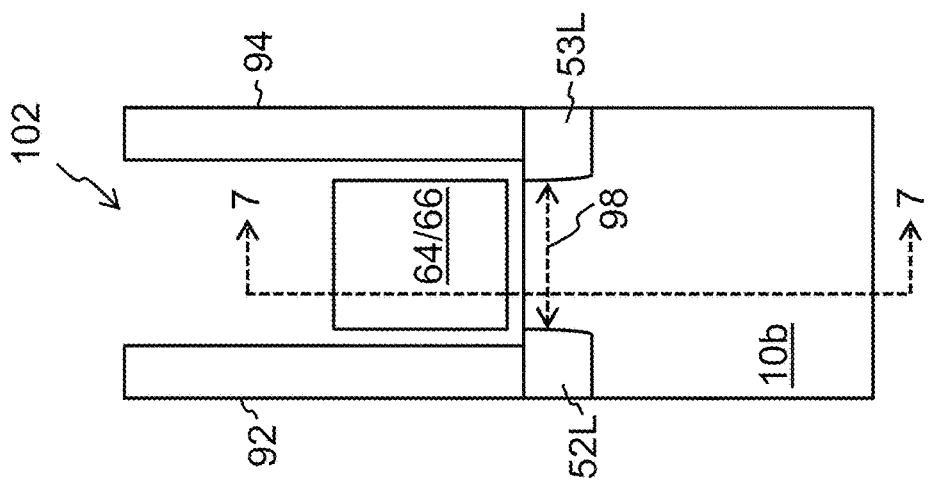

FIG. 6 shows a portion of a logic device 102, formed along one of the fins 10b in logic device area 4, which includes a source region 52L and a drain region 53L that define a channel region 98 of the semiconductor substrate there between. The channel region 98 extends along the top and side surfaces 10e and 10f of the fin 10b between the source and drain regions 52L/53L. The remainder of TiN layer 64 and tungsten layer 66 together are a logic gate which wraps around the top and side surfaces 10e and 10f of the fin 10b for controlling the conductivity of the channel region 98, as best shown in FIG. 7. For the logic device 102 in the figures, the logic gate formed by the remainder of TiN layer 64 and tungsten layer 66, source contact 92 and drain contact 94 all extend across eight fins 10b, so that eight channel regions 98 on eight fins 10b are operated simultaneously as a single logic device 102, to provide eight times the operating current that would be supplied by a logic device formed on only a single fin. However, the number of fins included in each logic device 102 can be any number (one or greater) depending upon the operating current needed from the logic device. Additionally, while only one logic device 102 is shown in the logic area 4, multiple logic devices 102 of the same or varying current capacity can be formed simultaneously in the logic area 4.

The above technique for forming logic devices and memory cells on the same substrate 10 has many advantages. First, all three gates (floating gate formed from poly block 30a, erase gate formed from poly block 44a, word line gate formed from poly block 44b) of the memory cell wrap around the top and side surfaces of fins 10a, which increases performance by increasing the effective area of the channel region 96 without commensurate lateral size increases, thus allowing the memory cells to be scaled to smaller lateral sizes. Second, the logic gate formed by the remainder of TiN layer 64 and tungsten layer 66 of the logic device 102 wraps around the top and side surfaces of fins 10b, which increases performance by increasing the effective area of the channel region 98 without commensurate lateral size increases, thus allowing the logic devices to be scaled to smaller lateral sizes. Third, the memory cells are formed in a recessed memory cell area 2 of the substrate 10 (relative to the logic device area 4), allowing for a thicker poly layer 44 for the memory cells without exceeding the height of the shorter logic devices in the logic device area 4, and which simplifies common formation steps in both areas 2/4. Fourth, only two polysilicon depositions are needed to form all three gates of the memory cells. Fifth, the same polysilicon deposition used to form the word line gates, i.e. poly blocks 44b and the erase gates, i.e. poly blocks 44a in the memory area 2 is also used to form dummy polysilicon strip 44c (i.e., dummy gate) in the logic device area 4 (which is later replaced with metal logic gate formed by the remainder of TiN layer 64 and tungsten layer 66) to simplify processing. Sixth, the tops of word line gates, i.e. poly blocks 44b, are salicided to reduce electrical resistance along the strips of polysilicon that form word line gates formed by poly blocks 44b for a row of the memory cells 100. Seventh, the metal for the logic gates formed by the remainder of TiN layer 64 and tungsten layer 66 provides higher conductivity and performance, while the polysilicon for the memory cell floating and erase gates formed by the respective poly blocks 30a/44a provides better control of tunneling through intervening tunnel oxide 38, and therefore better control of erase efficiency. Eighth, a majority of the process fabrication for the memory cells (including the formation of all three poly gates for the memory cells) is performed before the formation of the metal logic gates, which reduces processing impacts on the CMOS baseline. Ninth, the word line gates formed by poly blocks 44b for a row of memory cells are formed continuously together as a continuous strip of polysilicon, the erase gates formed by poly blocks 44a for a row of memory cells are formed continuously together as a continuous strip of polysilicon, and the logic gates formed by the remainder of TiN layer 64 and tungsten layer 66 for a plurality of fins 10b are formed continuously together as a strip of metal, for ease of manufacturing and gate interconnection.

It is to be understood that the present invention is not limited to the embodiment(s) described above and illustrated herein. For example, references to the present invention herein are not intended to limit the scope of any claim or claim term, but instead merely make reference to one or more features that may be covered by one or more claims.

Materials, processes and numerical examples described above are exemplary only, and should not be deemed to limit the claims. Further, as is apparent from the claims and specification, not all method steps need be performed in the exact order illustrated or claimed, but rather in any order (unless there is an explicitly recited limitation on any order) that allows the proper formation of the memory cells and logic devices of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A method of forming a device, comprising:
   providing a silicon substrate with an upper surface and having first and second areas;
   removing portions of the silicon substrate in the first area of the silicon substrate to form an upwardly extending first silicon fin having a pair of side surfaces extending up and terminating at a top surface, and in the second area of the silicon substrate to form an upwardly extending second silicon fin having a pair of side surfaces extending up and terminating at a top surface;
   performing a first implantation to form a first source region in the first silicon fin;
   performing a second implantation to form a first drain region in the first silicon fin and to form a second source region and a second drain region in the second silicon fin, wherein the first source region and the first drain region define a first channel region of the first silicon fin extending there between, and wherein the second source region and the second drain region define a second channel region of the second silicon fin extending there between;
   forming a floating gate disposed over and insulated from a first portion of the first channel region using a first polysilicon deposition, wherein the floating gate wraps around the top and side surfaces of the first silicon fin;
   forming an erase gate disposed over and insulated from the first source region, and a word line gate disposed over and insulated from a second portion of the first channel region, and a dummy gate disposed over and insulated from the second channel region, using a second polysilicon deposition, wherein:
      the erase gate wraps around the top and side surfaces of the first silicon fin,
      the word line gate wraps around the top and side surfaces of the first silicon fin,
      the dummy gate wraps around the top and side surfaces of the second silicon fin;
   and
   replacing the dummy gate with a metal gate that is disposed over and insulated from the second channel region, wherein the metal gate wraps around the top and side surfaces of the second silicon fin.

2. The method of claim 1, wherein before the removing of the portions of the silicon substrate in the first and second areas of the silicon substrate to form the upwardly extending first and second silicon fins, the method further comprising:
   recessing the upper surface in the first area of the silicon substrate without recessing the upper surface in the second area of the silicon substrate.

3. The method of claim 1, wherein the replacing of the dummy gate with the metal gate comprises:
   removing the dummy gate from over the second channel region; and
   forming the metal gate over and insulated from the second channel region using at least one metal deposition.

4. The method of claim 1, wherein the performing of the first implantation is performed after the first polysilicon deposition and before the second polysilicon deposition.

5. The method of claim 1, wherein the removing of the portions of the silicon substrate to form the upwardly extending first and second silicon fins comprises:
   forming a first insulation layer on the silicon substrate;
   forming a second insulation layer on the first insulation layer;
   forming strips of material on the second insulation layer;
   forming spacers on the second insulation layer and along the strips of material;
   removing the strips of material;
   removing portions of the first and second insulation layers between the spacers to expose portions of the silicon substrate; and
   performing an etch of the exposed portions of the silicon substrate.

6. The method of claim 1, wherein:
   the removing of the portions of the silicon substrate to form the upwardly extending first and second silicon fins further comprises removing portions of the silicon substrate in the second area of the silicon substrate to form an upwardly extending third silicon fin having a pair of side surfaces extending up and terminating at a top surface;
   the performing the second implantation further includes forming a third source region and a third drain region in the third silicon fin, wherein the third source region and the third drain region define a third channel region of the third silicon fin extending there between;
   the forming of the dummy gate is performed so that dummy gate is disposed over and insulated from the third channel region and wraps around the top and side surfaces of the third silicon fin; and
   the replacing the dummy gate with the metal gate is performed so that the metal gate is disposed over and insulated from the third channel region and wraps around the top and side surfaces of the third silicon fin.

7. The method of claim 1, further comprising:
   forming salicide on a top surface of the word line gate.

8. The method of claim 1, wherein the word line gate is insulated from the second portion of the first channel region by a first oxide layer, and the metal gate is insulated from the second channel region by a layer of high K material and a second oxide layer different from the first oxide layer.

9. The method of claim 1, wherein the floating gate is insulated from the first portion of the first channel region by a first oxide layer, the word line gate is insulated from the second portion of the first channel region by a second oxide layer different from the first oxide layer, and the metal gate is insulated from the second channel region by a layer of high K material and a third oxide layer different from the second oxide layer.

10. A method of forming a device, comprising:
providing a silicon substrate with an upper surface and having first and second areas;
removing portions of the silicon substrate in the first area of the silicon substrate to form a plurality of upwardly extending first silicon fins each having a pair of side surfaces extending up and terminating at a top surface, and in the second area of the silicon substrate to form a plurality of upwardly extending second silicon fins each having a pair of side surfaces extending up and terminating at a top surface;
performing a first implantation to form a first source region in each of the first silicon fins;
performing a second implantation to form a first drain region in each of the first silicon fins and to form a second source region and a second drain region in each of the second silicon fins, wherein for each of the first silicon fins the first source region and the first drain region define a first channel region of the first silicon fin extending there between, and wherein for each of the second silicon fins the second source region and the second drain region define a second channel region of the second silicon fin extending there between;
forming a plurality of floating gates each disposed over and insulated from a first portion of one of the first channel regions using a first polysilicon deposition, wherein each of the floating gates wraps around the top and side surfaces of one of the first silicon fins;
forming a plurality of erase gates each disposed over and insulated from one of the first source regions, and a plurality of word line gates each disposed over and insulated from a second portion of one of the first channel regions, and a plurality of dummy gates each disposed over and insulated from one of the second channel regions, using a second polysilicon deposition, wherein:
each of the erase gates wraps around the top and side surfaces of one of the first silicon fins,
each of the word line gates wraps around the top and side surfaces of one of the first silicon fins,
each of the dummy gates wraps around the top and side surfaces of one of the second silicon fins; and
replacing each of the dummy gates with a metal gate that is disposed over and insulated from one of the second channel regions, wherein each of the metal gates wraps around the top and side surfaces of one of the second silicon fins.

11. The method of claim 10, wherein before the removing of the portions of the silicon substrate in the first and second areas of the silicon substrate to form the upwardly extending first and second silicon fins, the method further comprising:
recessing the upper surface in the first area of the silicon substrate without recessing the upper surface in the second area of the silicon substrate.

12. The method of claim 10, wherein the replacing of the dummy gates with the metal gates comprises:
removing the dummy gates from over the second channel regions; and
forming the metal gates over and insulated from the second channel regions using at least one metal deposition.

13. The method of claim 10, wherein the performing of the first implantation is performed after the first polysilicon deposition and before the second polysilicon deposition.

14. The method of claim 10, wherein the removing of the portions of the silicon substrate to form the upwardly extending first and second silicon fins comprises:
forming a first insulation layer on the silicon substrate;
forming a second insulation layer on the first insulation layer;
forming strips of material on the second insulation layer;
forming spacers on the second insulation layer and along the strips of material;
removing the strips of material;
removing portions of the first and second insulation layers between the spacers to expose portions of the silicon substrate; and
performing an etch of the exposed portions of the silicon substrate.

15. The method of claim 10, further comprising:
forming salicide on a top surface of each of the word line gates.

16. The method of claim 10, wherein the word line gates are insulated from the second portions of the first channel regions by a first oxide layer, and the metal gates are insulated from the second channel regions by the layer of high K material and a second oxide layer different from the first oxide layer.

17. The method of claim 10, wherein the floating gates are insulated from the first portions of the first channel regions by a first oxide layer, the word line gates are insulated from the second portions of the first channel regions by a second oxide layer different from the first oxide layer, and the metal gates are insulated from the second channel regions by a layer of high K material and a third oxide layer different from the second oxide layer.

18. The method of claim 10, wherein:
the plurality of erase gates are formed as a continuous strip of polysilicon,
the plurality of word line gates are formed as a continuous strip of polysilicon, and
the plurality of metal gates are formed as a continuous strip of metal.

* * * * *